(12) United States Patent
Li et al.

(10) Patent No.: US 10,332,590 B2
(45) Date of Patent: Jun. 25, 2019

(54) STATIC RANDOM ACCESS MEMORY (SRAM) BIT CELLS EMPLOYING CURRENT MIRROR-GATED READ PORTS FOR REDUCED POWER CONSUMPTION

(71) Applicant: QUALCOMM Incorporated, San Diego, CA (US)

(72) Inventors: Xia Li, San Diego, CA (US); Jianguo Yao, Londonderry, NH (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/711,110

(22) Filed: Sep. 21, 2017

(65) Prior Publication Data

US 2019/0088310 A1    Mar. 21, 2019

(51) Int. Cl.
| | |
|---|---|
| *G11C 11/419* | (2006.01) |
| *G11C 11/4094* | (2006.01) |
| *G11C 11/4091* | (2006.01) |
| *G11C 11/4074* | (2006.01) |
| *G11C 7/10* | (2006.01) |
| *G11C 11/412* | (2006.01) |
| *G11C 11/56* | (2006.01) |
| *G11C 8/16* | (2006.01) |

(52) U.S. Cl.
CPC ......... *G11C 11/419* (2013.01); *G11C 7/1006* (2013.01); *G11C 11/4074* (2013.01); *G11C 11/4091* (2013.01); *G11C 11/4094* (2013.01); *G11C 11/412* (2013.01); *G11C 11/56* (2013.01); *G11C 8/16* (2013.01)

(58) Field of Classification Search
CPC .................................................. G11C 11/412
USPC .......................................................... 365/154
See application file for complete search history.

(56) References Cited

U.S. PATENT DOCUMENTS

| | | | |
|---|---|---|---|
| 7,400,523 B2 | 7/2008 | Houston | |
| 7,710,763 B2 | 5/2010 | Houston | |
| 8,913,455 B1* | 12/2014 | Camarota | ........... H01L 21/8238 |
| | | | 365/230.05 |
| 9,042,162 B2 | 5/2015 | Lee et al. | |
| 9,424,909 B1 | 8/2016 | Mojumder et al. | |
| 2011/0194360 A1* | 8/2011 | Yamada | ................. G11C 29/02 |
| | | | 365/189.07 |
| 2014/0177319 A1* | 6/2014 | Park | .................... G11C 13/004 |
| | | | 365/148 |

(Continued)

*Primary Examiner* — Min Huang
(74) *Attorney, Agent, or Firm* — W&T/Qualcomm

(57) ABSTRACT

Static random access memory (SRAM) bit cells employing current mirror-gated read ports for reduced power consumption are disclosed. In one aspect, an SRAM bit cell includes a read port employing a first transistor electrically coupled to a current sum line and to a current mirror circuit. A level of current that flows through the first transistor in response to voltage applied by the current mirror circuit correlates to a magnitude of the voltage. The read port includes a second transistor electrically coupled to the first transistor, to a driver circuit, and to an output node of a first inverter. Connecting the first and second transistors of the read port in this manner allows a voltage applied to the second transistor to generate a current that flows to the first transistor if the second transistor is activated. The current level depends on the voltage applied by the current mirror circuit.

31 Claims, 15 Drawing Sheets

(56) References Cited

U.S. PATENT DOCUMENTS

| | | | |
|---|---|---|---|
| 2014/0254248 A1* | 9/2014 | Huang | G11C 11/412 365/154 |
| 2015/0262661 A1* | 9/2015 | Chu | G11C 11/5678 365/163 |
| 2016/0064068 A1* | 3/2016 | Mojumder | G11C 11/405 365/156 |
| 2017/0133387 A1 | 5/2017 | Huang et al. | |
| 2017/0345505 A1* | 11/2017 | Noel | G11C 14/0063 |

* cited by examiner

STATIC RANDOM ACCESS MEMORY (SRAM) BIT CELLS EMPLOYING CURRENT MIRROR-GATED READ PORTS FOR REDUCED POWER CONSUMPTION

BACKGROUND

I. Field of the Disclosure

The technology of the disclosure relates generally to static random access memory (SRAM), and particularly to transistor SRAM bit cells employing modified read ports for reduced power consumption.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single binary data value or bit is stored. Read and write operations are performed on a particular SRAM bit cell using read and write word lines which correspond to the SRAM bit cell row that includes the particular SRAM bit cell.

Data stored in an SRAM data array can be used for a multitude of operations. For example, artificial intelligence (AI) applications may employ SRAM data arrays to store data used for neural synapse computations. More specifically, neural synapse computations conventionally include performing a series of matrix multiplication operations, because such computations model the propagation of neurons across synapses in neural networks. Thus, data stored in an SRAM data array may correspond to matrices used as operands in such matrix multiplication operations. However, to perform matrix multiplication operations as described above, data stored in an SRAM data array must first be sensed and then provided to a separate multiplication circuit that performs the matrix multiplication operation.

For example, FIG. 1 illustrates an exemplary system 100 that employs a conventional SRAM data array 102, a sense amplifier 104, and a multiplication circuit 106 used to multiply matrix data stored in the SRAM data array 102. In particular, the SRAM data array 102 includes SRAM bit cells 108(1)(1)-108(M)(N) organized into SRAM columns 110(1)-110(N) and SRAM rows 112(1)-112(M). Data may be written to each SRAM bit cell 108(1)(1)-108(M)(N) using a corresponding write circuit 114, control circuit 116, and address decoder circuit 118. For example, data corresponding to a matrix having N columns and M rows may be written to and stored in the SRAM bit cells 108(1)(1)-108(M)(N). To perform a matrix multiplication operation on a matrix stored in the SRAM data array 102, data from each of the SRAM bit cells 108(1)(1)-108(M)(N) is first read using a pre-charge circuit 120 and the sense amplifier 104. The sensed data is then provided to an output buffer circuit 122, which stores the read data until the multiplication circuit 106 is ready to use the read data as an operand in a matrix multiplication operation. Thus, performing a matrix multiplication operation using the system 100 includes first sensing the data in the SRAM data array 102, and then performing the operation using the multiplication circuit 106, wherein each step and related circuitry consumes time, area, and power.

SUMMARY OF THE DISCLOSURE

Aspects disclosed herein include static random access memory (SRAM) bit cells employing current mirror-gated read ports for reduced power consumption. In one aspect, an SRAM bit cell includes cross-coupled inverters configured to store a binary data value. The SRAM bit cell also includes a read port employing a first transistor having a first node electrically coupled to a current sum line, and a gate node electrically coupled to a current mirror circuit. In particular, a level of current that flows through the first transistor in response to a voltage applied to the gate node by the current mirror circuit correlates to a magnitude of the voltage. In this manner, the current mirror circuit can increase or decrease the direct current flowing in the first transistor to increase or decrease power consumption. The read port also includes a second transistor having a first node electrically coupled to a second node of the first transistor, a second node electrically coupled to a driver circuit, and a gate node electrically coupled to an output node of the first inverter. Connecting the first and second transistors of the read port in this manner allows a voltage applied to the first node of the second transistor to generate a current that flows to the first transistor if the second transistor is activated. Some or all of the current may traverse the first transistor to the current sum line, wherein the current level depends on the voltage applied by the current mirror circuit. The current on the current sum line correlates to the data value stored in the SRAM bit cell.

In this regard, multiple SRAM bit cells can be electrically coupled to form a multi-level cell (MLC) SRAM cell configured to store a multi-bit value that serves as a first operand in a multiplication operation performed by the MLC SRAM cell. Additionally, a voltage applied to the gate node of the first transistor of each SRAM bit cell by a corresponding current mirror circuit correlates to a magnitude of the voltage of a multi-bit value that serves as a second operand in the multiplication operation. The read port of each SRAM bit cell can cause current to flow to an MLC current sum line based on the binary data value stored in the SRAM bit cell and the voltage applied by the current mirror circuit. In this manner, for each SRAM bit cell, if a particular binary data value is stored in the SRAM bit cell, a current correlating to the magnitude of the voltage applied to the input node in which the voltage applied by the current mirror circuit allows to traverse through each read port is added to the MLC current sum line. As a result, the magnitude of the current on the MLC current sum line is an analog representation of the first operand (e.g., the multi-bit value stored in the MLC SRAM cell) multiplied by the second operand (e.g., the multi-bit value corresponding to the voltage applied by the current mirror circuit). Employing the configuration above allows the MLC SRAM cell to perform a multiplication operation, rather than sensing the stored binary data values and providing the binary data values to a separate multiplication circuit. Because the MLC SRAM cell can perform a multiplication operation as described above, multiple instances of the MLC SRAM cell can be employed to perform matrix multiplication while consuming less time, area, and power as compared to systems that multiply matrices using conventional SRAM data arrays and multiplication circuits.

In this regard in one aspect, an SRAM bit cell is provided. The SRAM bit cell comprises a current mirror input node, a driver node, and a current output node electrically coupled to a current sum line. The SRAM bit cell further comprises a first inverter and a second inverter cross-coupled to and configured to store a binary data value. The SRAM bit cell further comprises a read port. The read port comprises a first transistor that includes a first node electrically coupled to the current output node, a second node, and a gate node electrically coupled to the current mirror input node. The current mirror input node is electrically coupled to a current mirror circuit configured to apply a voltage to the gate node of the first transistor, wherein a level of current that flows from the second node of the first transistor to the first node of the first transistor correlates to a magnitude of the voltage. The read port further comprises a second transistor that includes a first node electrically coupled to the second node of the first transistor, a second node electrically coupled to the driver node that is electrically coupled to a driver circuit configured to apply a voltage to the second node of the second transistor, and a gate node electrically coupled to an output node of the first inverter.

In another aspect, an MLC SRAM cell is provided. The MCL SRAM comprises an MLC current mirror input node, an MLC driver node electrically coupled to a driver circuit configured to apply a voltage to the MLC driver node, an MLC current output node electrically coupled to an MLC current sum line, and one or more SRAM bit cells. Each SRAM bit cell of the one or more SRAM bit cells comprises a current mirror input node electrically coupled to the MLC current mirror input node, a driver node electrically coupled to the MLC driver node, and a current output node electrically coupled to the MLC current output node. Each SRAM bit cell further comprises a first inverter and a second inverter cross-coupled to and configured to store a binary data value. Each SRAM bit cell further comprises a read port. The read port comprises a first transistor that includes a first node electrically coupled to the current output node of the corresponding SRAM bit cell, a second node, and a gate node electrically coupled to the current mirror input node of the corresponding SRAM bit cell. The MLC current mirror input node is electrically coupled to a current mirror circuit configured to apply a voltage to the gate node of the first transistor, and a level of current that flows from the second node of the first transistor to the first node of the first transistor correlates to a magnitude of the voltage. The read port further comprises a second transistor that includes a first node electrically coupled to the second node of the first transistor, a second node electrically coupled to the corresponding driver node, and a gate node electrically coupled to an output node of the first inverter.

In another aspect, an MLC SRAM matrix array multiplication circuit is provided. The MCL SRAM matrix array multiplication circuit comprises a plurality of MLC SRAM cells organized into a plurality of MLC SRAM cell rows and a plurality of MLC SRAM cell columns, wherein each MLC SRAM cell of the plurality of MLC SRAM cells corresponds to an MLC SRAM cell row and an MLC SRAM cell column. Each MLC SRAM cell comprises an MLC current mirror input node, an MLC driver node electrically coupled to a driver circuit configured to apply a voltage to the MLC driver node, an MLC current output node, and one or more SRAM bit cells. Each SRAM bit cell of the one or more SRAM bit cells comprises a current mirror input node electrically coupled to the MLC current mirror input node, a driver node electrically coupled to the MLC driver node, and a current output node electrically coupled to the MLC current output node. Each SRAM bit cell also comprises a first inverter and a second inverter cross-coupled to and configured to store a binary data value. Each SRAM bit cell also comprises a read port. The read port comprises a first transistor that includes a first node electrically coupled to the current output node of the corresponding SRAM bit cell, a second node, and a gate node electrically coupled to the current mirror input node of the corresponding SRAM bit cell. The MLC current mirror input node is electrically coupled to a current mirror circuit configured to apply a voltage to the gate node of the first transistor, and a level of current that flows from the second node of the first transistor to the first node of the first transistor correlates to a magnitude of the voltage. The read port further comprises a second transistor that includes a first node electrically coupled to the second node of the first transistor, a second node electrically coupled to the corresponding driver node, and a gate node electrically coupled to an output node of the first inverter. The MLC SRAM matrix array multiplication circuit further comprises a plurality of current sum lines, wherein each current sum line of the plurality of current sum lines is electrically coupled to the MLC current output node of each MLC SRAM cell of a corresponding subset of MLC SRAM cells of the plurality of MLC SRAM cells. The MLC SRAM matrix array multiplication circuit further comprises a plurality of driver lines, wherein each driver line of the plurality of driver lines is electrically coupled to the MLC driver node of each MLC SRAM cell of a corresponding subset of MLC SRAM cells of the plurality of MLC SRAM cells. The MLC SRAM matrix array multiplication circuit further comprises a plurality of current mirror lines, wherein each current mirror line of the plurality of current mirror lines is electrically coupled to the MLC current mirror input node of each MLC SRAM cell of a corresponding subset of MLC SRAM cells of the plurality of MLC SRAM cells.

In another aspect, a method of using an MLC SRAM matrix array multiplication circuit to multiply matrices is provided. The method comprises writing a binary data value to each SRAM bit cell of one or more SRAM bit cells of each MLC SRAM cell of a plurality of MLC SRAM cells organized into a plurality of MLC SRAM cell rows and a plurality of MLC SRAM cell columns. Each MLC SRAM cell of the plurality of MLC SRAM cells corresponds to an MLC SRAM cell row and an MLC SRAM cell column and a multi-bit data value stored in each MLC SRAM cell correlates to a first operand determined based on the binary data value stored in each SRAM bit cell. The method further comprises applying a plurality of voltages to a corresponding plurality of driver lines, wherein each driver line of the plurality of driver lines corresponds to an MLC SRAM cell column and is electrically coupled to an MLC driver node of each MLC SRAM cell of the corresponding MLC SRAM cell column that is coupled to a driver node of each SRAM bit cell of each corresponding MLC SRAM cell. The method further comprises applying a plurality of voltages to a corresponding plurality of current mirror lines, wherein each current mirror line of the plurality of current mirror lines corresponds to an MLC SRAM cell row and is electrically coupled to an MLC current mirror input node of each MLC SRAM cell of the corresponding MLC SRAM cell row that is coupled to a current mirror input node of each SRAM bit cell of each corresponding MLC SRAM cell, and a magnitude of each voltage correlates to a second operand corresponding to a value of an entry in a matrix. The method further comprises, for each iteration of applying the plurality of voltages to the plurality of current mirror lines, combining currents present on an MLC current output node of each corresponding MLC SRAM cell of the corresponding MLC SRAM cell column electrically coupled to the current output node of each corresponding SRAM bit cell and a current sum line such that a total current on the corresponding current sum line has a magnitude corresponding to a summation of each multi-bit product of each corresponding first operand and each corresponding second operand.

DETAILED DESCRIPTION

Figure 1:
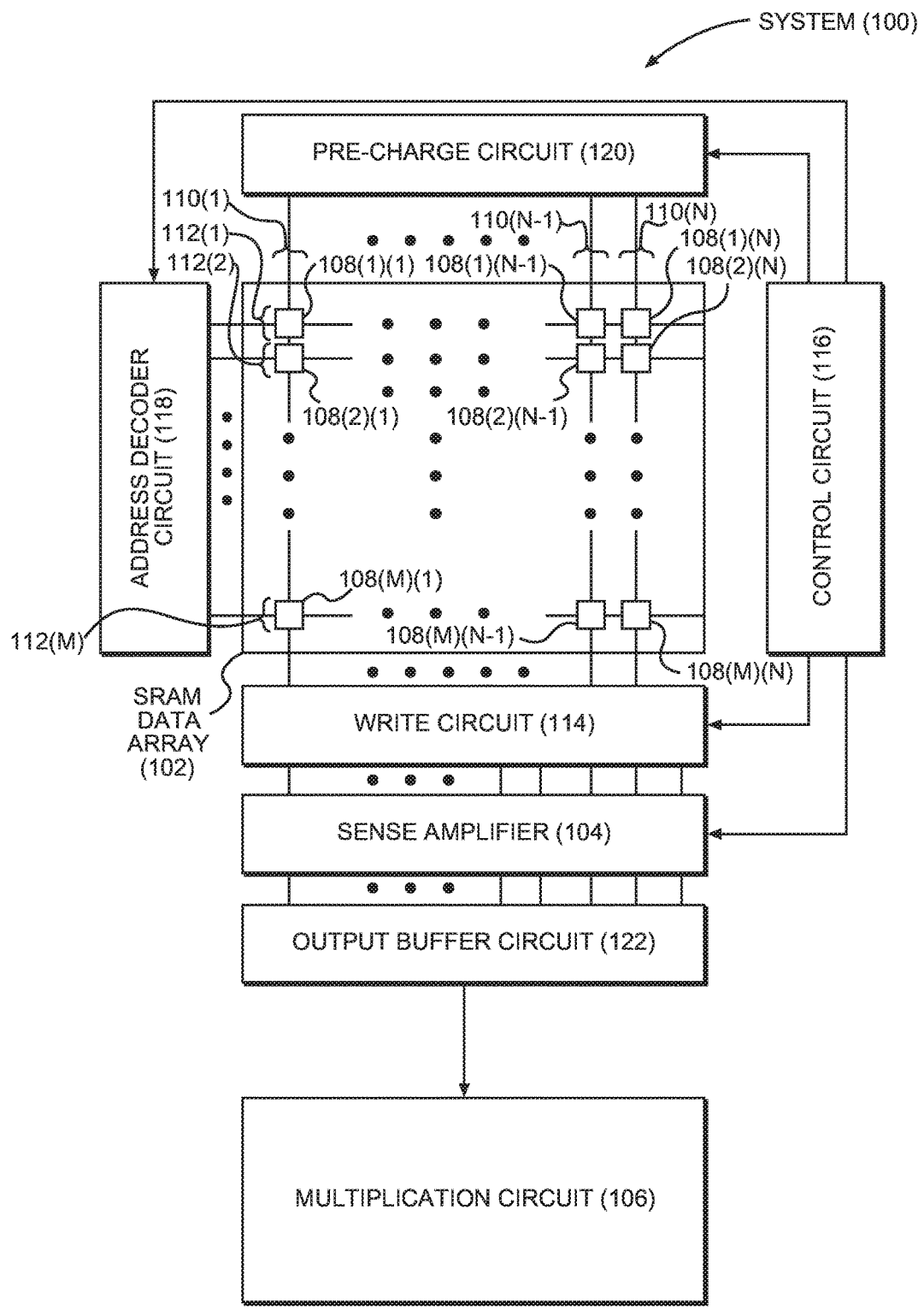
FIG. 1 is a block diagram of an exemplary system that employs a conventional static random access memory (SRAM) data array, a sense amplifier, and a multiplication circuit to multiply matrix data stored in the SRAM data array.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include static random access memory (SRAM) bit cells employing current mirror-gated read ports for reduced power consumption. In one aspect, an SRAM bit cell includes cross-coupled inverters configured to store a binary data value. The SRAM bit cell also includes a read port employing a first transistor having a first node electrically coupled to a current sum line, and a gate node electrically coupled to a current mirror circuit. In particular, a level of current that flows through the first transistor in response to a voltage applied to the gate node by the current mirror circuit correlates to a magnitude of the voltage. In this manner, the current mirror circuit can increase or decrease the direct current flowing in the first transistor to increase or decrease power consumption. The read port also includes a second transistor having a first node electrically coupled to a second node of the first transistor, a second node electrically coupled to a driver circuit, and a gate node electrically coupled to an output node of the first inverter. Connecting the first and second transistors of the read port in this manner allows a voltage applied to the first node of the second transistor to generate a current that flows to the first transistor if the second transistor is activated. Some or all of the current may traverse the first transistor to the current sum line, wherein the current level depends on the voltage applied by the current mirror circuit. The current on the current sum line correlates to the binary data value stored in the SRAM bit cell.

In this regard, multiple SRAM bit cells can be electrically coupled to form a multi-level cell (MLC) SRAM cell configured to store a multi-bit value that serves as a first operand in a multiplication operation performed by the MLC SRAM cell. Additionally, a voltage applied to the gate node of the first transistor of each SRAM bit cell by a corresponding current mirror circuit correlates to a magnitude of the voltage of a multi-bit value that serves as a second operand in the multiplication operation. The read port of each SRAM bit cell can cause current to flow to an MLC current sum line based on the binary data value stored in the SRAM bit cell and the voltage applied by the current mirror circuit. In this manner, for each SRAM bit cell, if a particular binary data value is stored in the SRAM bit cell, a current correlating to the magnitude of the voltage applied to the drive node in which the voltage applied by the current mirror circuit allows to traverse through each read port is added to the MLC current sum line. As a result, the magnitude of the current on the MLC current sum line is an analog representation of the first operand (e.g., the multi-bit value stored in the MLC SRAM cell) multiplied by the second operand (e.g., the multi-bit value corresponding to the voltage applied by the current mirror circuit). Employing the configuration above allows the MLC SRAM cell to perform a multiplication operation, rather than sensing the stored binary data values and providing the binary data values to a separate multiplication circuit. Because the MLC SRAM cell can perform a multiplication operation as described above, multiple instances of the MLC SRAM cell can be employed to perform matrix multiplication while consuming less time, area, and power as compared to systems that multiply matrices using conventional SRAM data arrays and multiplication circuits.

Figure 2:
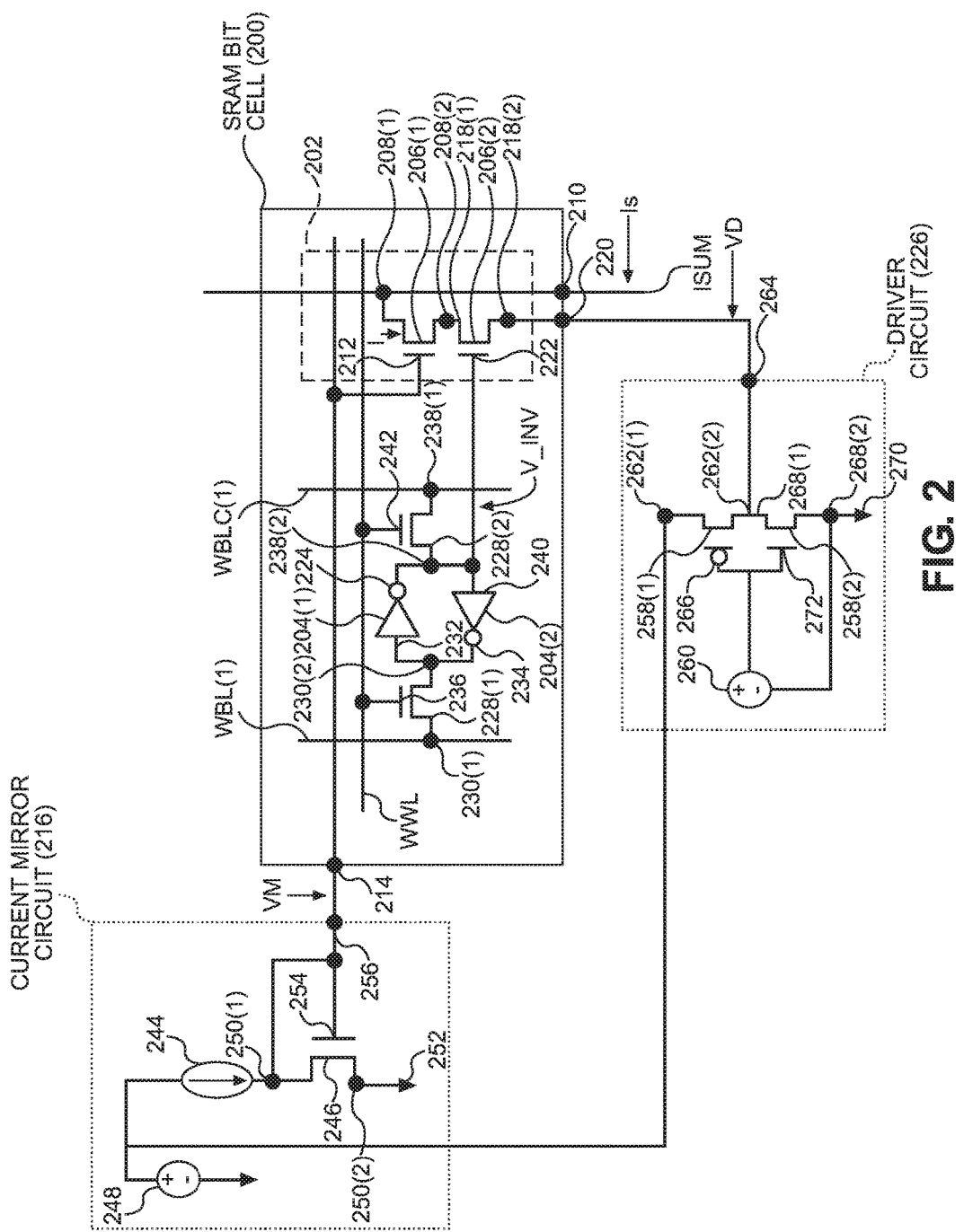
FIG. 2 is a circuit diagram of an exemplary SRAM bit cell employing a current mirror-gated read port for reduced power consumption.

In this regard, FIG. 2 illustrates an exemplary SRAM bit cell 200 employing a current mirror-gated read port 202 for reduced power consumption. The SRAM bit cell 200 includes a first inverter 204(1) cross-coupled with a second inverter 204(2) such that the SRAM bit cell 200 is configured to store a binary data value (i.e., either a logic '1' or a logic '0'). The read port 202 includes a first transistor 206(1) and a second transistor 206(2). The first transistor 206(1) includes a first node 208(1) electrically coupled to a current output node 210 electrically coupled to a current sum line ISUM, a second node 208(2), and a gate node 212 electrically coupled to a current mirror input node 214 of the SRAM bit cell 200. As described in more detail below, the current mirror input node 214 is electrically coupled to a current mirror circuit 216 used to apply a voltage VM to the gate node 212 so as to control a level of current I that flows through the first transistor 206(1) (i.e., direct current). The second transistor 206(2) includes a first node 218(1) electrically coupled to the second node 208(2) of the first transistor 206(1), a second node 218(2) electrically coupled to a driver node 220 of the SRAM bit cell 200, and a gate node 222 electrically coupled to an output node 224 of the first inverter 204(1). As described in more detail below, in this aspect, the driver node 220 is electrically coupled to a driver circuit 226 used to apply a voltage VD used for reading the SRAM bit cell 200. Configuring the read port 202 in this manner allows a voltage V_INV applied to the second transistor 206(2) to cause a current I to flow to the first transistor 206(1) if the second transistor 206(2) is activated. Some or all of the current I may traverse the first and second transistors 206(1), 206(2) to the current sum line ISUM, wherein the amount of current I depends on the voltage VM applied by the current mirror circuit 216. The current I on the current sum line ISUM correlates to and is an analog representation of the binary data value stored in the SRAM bit cell 200.

With continuing reference to FIG. 2, the SRAM bit cell 200 also includes a first access transistor 228(1) and a second access transistor 228(2). In particular, the first access transistor 228(1) includes a first node 230(1) electrically coupled to a corresponding write bit line WBL(1)-WBL(N), a second node 230(2) electrically coupled to an input node 232 of the first inverter 204(1) and an output node 234 of the second inverter 204(2), and a gate node 236 electrically coupled to a write word line WWL. The second access transistor 228(2) includes a first node 238(1) electrically coupled to a corresponding complement write bit line WBLC(1)-WBLC(N), a second node 238(2) electrically coupled to an input node 240 of the second inverter 204(2) and the output node 224 of the first inverter 204(1), and a gate node 242 electrically coupled to the write word line WWL. In this manner, a binary data value can be written to the SRAM bit cell 200 by activating the first and second access transistors 228(1), 228(2) using the write word line WWL, and providing the binary data value via the corresponding write bit line WBL(1)-WBL(N). The complement of the binary data value is provided via the corresponding complement write bit line WBLC(1)-WBLC(N). In this aspect, the first and second access transistors 228(1), 228(2) are both N-type MOS (NMOS) transistors. Thus, the first and second access transistors 228(1), 228(2) can be activated by applying a logic high voltage to the write word line WWL.

With continuing reference to FIG. 2, details of the current mirror circuit 216 are now provided. As noted above, the current mirror circuit 216 is used to control a voltage VM applied to the gate node 212 so as to control a level of current I that flows through the first transistor 206(1) (i.e., direct current). In this aspect, the current mirror circuit 216 includes a current source 244, a transistor 246 (e.g., an N-type MOS (NMOS) transistor 246) which is the same type and approximately the same size/size ratio as the first transistor 206(1), and a voltage supply 248. For example, the current source 244 may be configured to generate a current between approximately zero (0) and eight (8) micro-Amperes (µA). The transistor 246 includes a first node 250(1) electrically coupled to the current source 244, a second node 250(2) electrically coupled to a ground source 252, and a gate node 254 electrically coupled to the current source 244 and an output node 256, wherein the output node 256 is electrically coupled to the current mirror input node 214 of the SRAM bit cell 200. In this manner, a magnitude of the voltage VM generated by the current mirror circuit 216 is dependent on the strength of the current I generated by the current source 244. Additionally, because the voltage VM generated by the current mirror circuit 216 is applied to the gate node 212 of the first transistor 206(1) in the read port 202, a level of the current I that flows from the second node 208(2) to the first node 208(1) of the first transistor 206(1) (i.e., direct current) and onto the current sum line ISUM via the current output node 210 correlates to the magnitude of the voltage VM. In other words, the first transistor 206(1) is activated to a level correlating to the magnitude of the voltage VM, wherein the level of current I that flows through the activated first transistor 206(1) correlates to the voltage VM. Controlling the level of current I that flows through the first transistor 206(1) (i.e., direct current) allows for controlling and reducing the power consumption of the read port 202 and of the SRAM bit cell 200.

With continuing reference to FIG. 2, details of the driver circuit 226 are now provided. As noted above, the driver circuit 226 is used to apply the voltage VD used for reading the SRAM bit cell 200. In this aspect, the driver circuit 226 includes a first transistor 258(1), a second transistor 258(2), and a voltage supply 260. The first transistor 258(1) includes a first node 262(1) electrically coupled to the voltage supply 248 of the current mirror circuit 216, a second node 262(2) electrically coupled to a driver output node 264, and a gate node 266 electrically coupled to the voltage supply 260. The second transistor 258(2) includes a first node 268(1) electrically coupled to the driver output node 264, a second node 268(2) electrically coupled to the voltage supply 260 and a ground source 270, and a gate node 272 electrically coupled to the voltage supply 260. The driver output node 264 is electrically coupled to the driver node 220 of the SRAM bit cell 200. In this manner, the driver circuit 226 is configured to apply the voltage VD used to transfer to the current sum line ISUM for a read operation of the SRAM bit cell 200. In particular, the voltage VD is applied to a driver node 220 of the SRAM bit cell 200, which is electrically coupled to the second node 218(2) of the second transistor 206(2). Because the gate node 222 of the second transistor 206(2) is electrically connected to the output node 224 of the first inverter 204(1), the second transistor 206(2) is activated in response to a voltage V_INV correlating to a logic '1' on the output node 224.

With continuing reference to FIG. 2, for an exemplary read operation, the current sum line ISUM initially has a charge correlating to logic '0' of the input node 232, and the first transistor 206(1) is activated in response to the voltage VM of the current mirror circuit 216. If the SRAM bit cell 200 stores a logic '0,' then a logic '1' of the output node 224 is applied to the gate node 222, which activates the second transistor 206(2) such that a current I correlating to a logic '–0' of the SRAM bit cell 200 is placed on the current sum line ISUM. Conversely, if the SRAM bit cell 200 stores a logic '1,' a logic '0' of the output node 224 is applied to the gate node 222, which does not activate the second transistor 206(2) such that a logic '1' of the SRAM bit cell 200 remains on the current sum line ISUM. In this manner, the SRAM bit cell 200 is configured to achieve negative logic computing for the SRAM bit state.

Figure 3A:
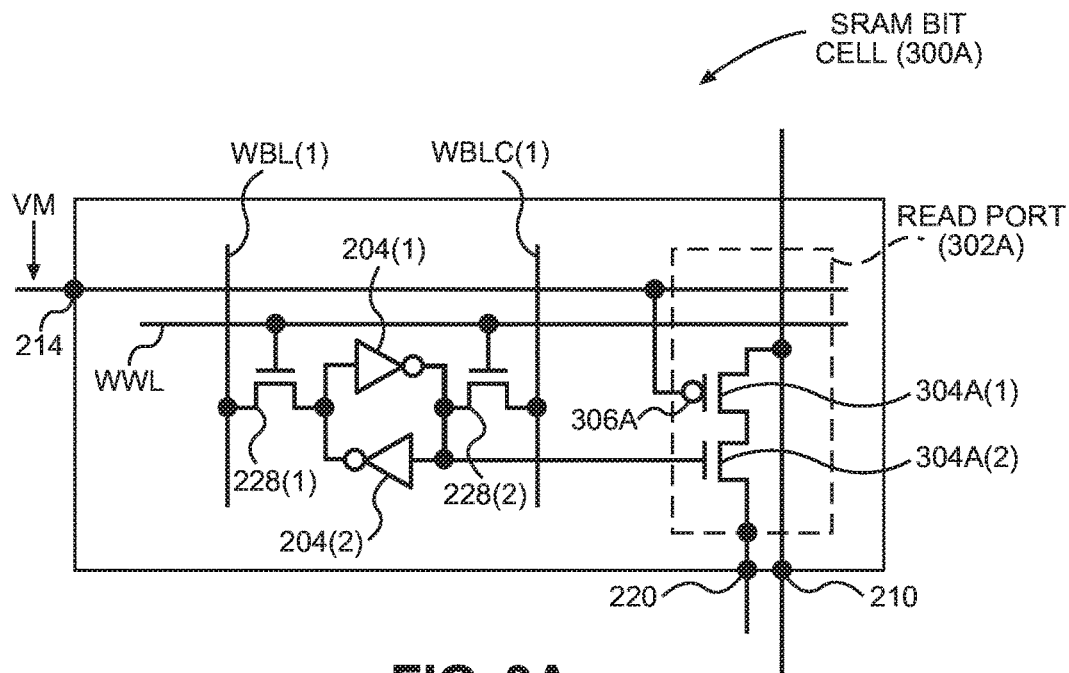
FIG. 3A is a circuit diagram of an exemplary SRAM bit cell employing a current mirror-gated read port for reduced power consumption, wherein the read port includes one N-type metal-oxide semiconductor (MOS) (NMOS) transistor and one P-type MOS (PMOS) transistor.
Figure 3B:
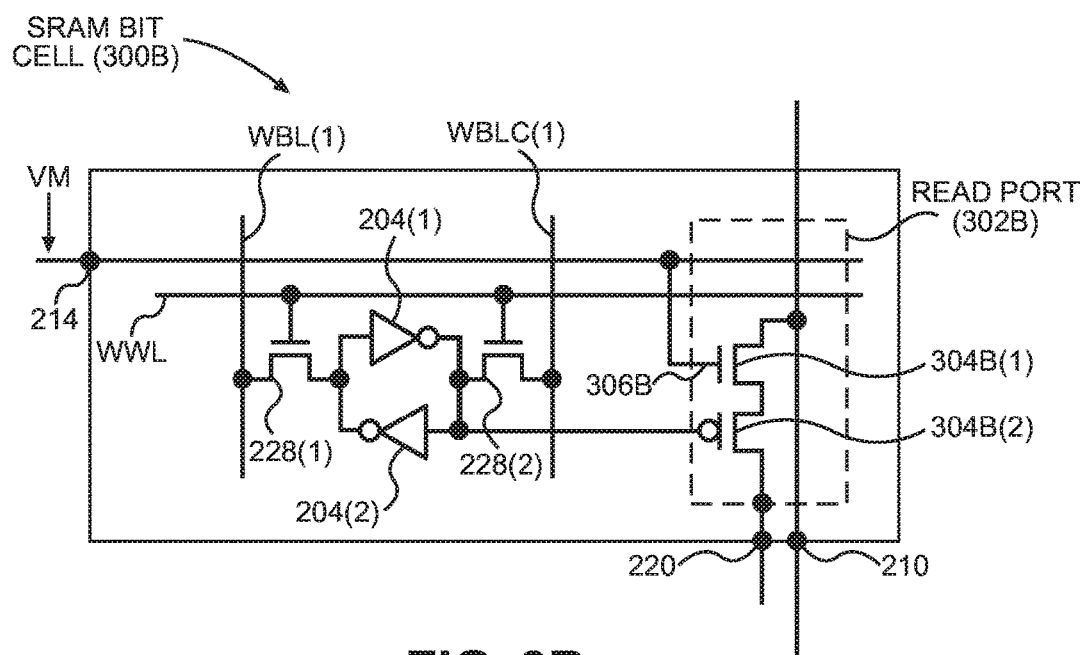
FIG. 3B is a circuit diagram of another exemplary SRAM bit cell employing a current mirror-gated read port for reduced power consumption, wherein the read port includes one NMOS transistor and one PMOS transistor.
Figure 3C:
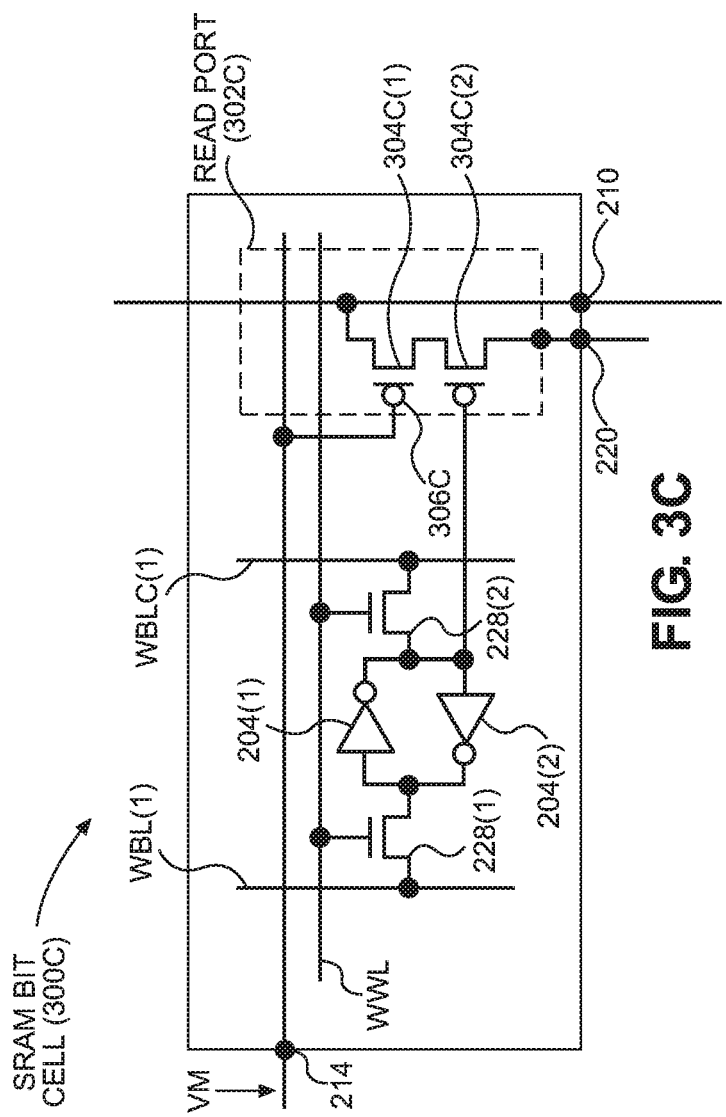
FIG. 3C is a circuit diagram of an exemplary SRAM bit cell employing a current mirror-gated read port for reduced power consumption, wherein the read port includes two (2) PMOS transistors.

FIGS. 3A-3C illustrate circuit diagrams of exemplary SRAM bit cells 300A, 300B, and 300C, respectively, that may include alternative elements from the SRAM bit cell 200 in FIG. 2 while achieving similar functionality. The SRAM bit cells 300A, 300B, and 300C include common elements with the SRAM bit cell 200 of FIG. 2, which are referred to with common element numbers in FIG. 2 and FIGS. 3A-3C, and thus will not re-described herein. In this regard, the SRAM bit cell 300A in FIG. 3A includes a read port 302A employing a PMOS transistor as a first transistor 304A(1), and an NMOS transistor as a second transistor 304A(2). Thus, in the SRAM bit cell 300A, a voltage VM correlating to a logic '0' is applied to a gate node 306A of the first transistor 304A(1) to activate the first transistor 304A(1) to perform a read operation. Although not illustrated, in this aspect, a corresponding current mirror device is employed as a PMOS transistor 246 rather than as an NMOS transistor 246 as illustrated in FIG. 2, wherein the transistor 246 has approximately the same size/size ratio as the first transistor 304A(1).). Further, the SRAM bit cell 300B in FIG. 3B includes a read port 302B employing an NMOS transistor as a first transistor 304B(1), and a PMOS transistor as a second transistor 304B(2). Thus, in the SRAM bit cell 300B, a voltage VM correlating to a logic '1' is applied to a gate node 306B of the first transistor 304B(1) to activate the first transistor 304B(1) to perform a read operation. Although not illustrated, in this aspect, the corresponding current mirror device is employed as an NMOS transistor 246 similar to the NMOS transistor 246 in FIG. 2, wherein the NMOS transistor 246 has approximately the same size/size ratio as the first transistor 304B(1). Additionally, the SRAM bit cell 300C in FIG. 3C includes a read port 302C employing a PMOS transistor as a first transistor 304C(1), and a PMOS transistor as a second transistor 304C(2). Thus, in the SRAM bit cell 300C, a voltage VM correlating to a logic '0' is applied to a gate node 306C of the first transistor 304C(1) to activate the first transistor 304C(1) to perform a read operation. Although not illustrated, in this aspect, the corresponding current mirror device is employed as a PMOS transistor 246 rather than as an NMOS transistor 246 as illustrated in FIG. 2, wherein the PMOS transistor 246 has approximately the same size/size ratio as the first transistor 304C(1).

Figure 4A:
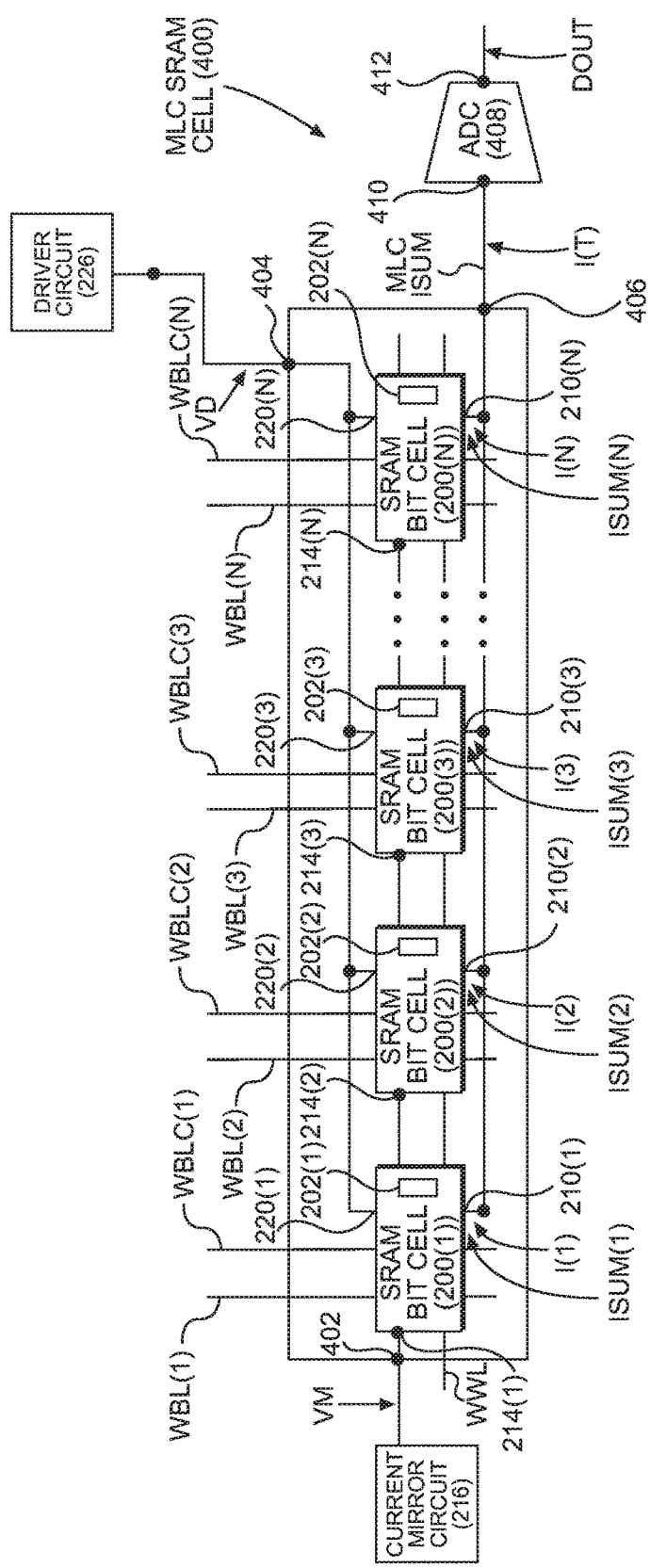
FIG. 4A is a block diagram of an exemplary multi-level cell (MLC) SRAM cell employing the SRAM bit cell of FIG. 2, and is configured to multiply a value stored in the MLC SRAM cell by a value input into the MLC SRAM cell.
Figure 4B:
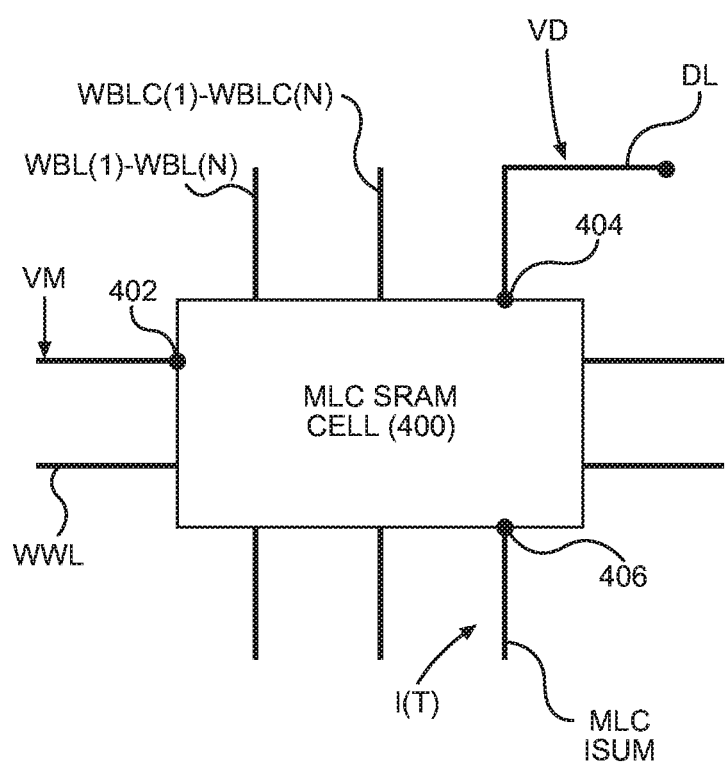
FIG. 4B is a simplified block diagram of the exemplary MLC SRAM cell of FIG. 4A.

As noted above, multiple instances of the SRAM bit cell 200 in FIG. 2 can be electrically coupled to form an MLC SRAM cell configured to perform a multiplication operation wherein a multi-bit value stored in the MLC SRAM cell serves as a first operand, and a multi-bit value input into the MLC SRAM cell serves as a second operand. In this regard, FIGS. 4A and 4B illustrate an exemplary MLC SRAM cell 400 employing N SRAM bit cells 200(1)-200(N) of FIG. 2 and configured to multiply a value stored in the MLC SRAM cell 400 by a value input into the MLC SRAM cell 400. FIG. 4A is a block diagram of the N bit MLC SRAM cell 400, and FIG. 4B is a simplified block diagram of the MLC SRAM cell 400. The MLC SRAM cell 400 includes common elements with the SRAM bit cell 200 of FIG. 2, which are referred to with common element numbers in FIG. 2 and FIGS. 4A and 4B, and thus will not re-described herein.

With continuing reference to FIGS. 4A and 4B, the MLC SRAM cell 400 includes an MLC current mirror input node 402 electrically coupled to a current mirror circuit 216, an MLC driver node 404 electrically coupled to a driver circuit 226 configured to apply a voltage VD to the MLC driver node 404, and an MLC current output node 406 electrically coupled to an MLC current sum line MLC ISUM. Additionally, each SRAM bit cell 200(1)-200(N) includes a current mirror input node 214(1)-214(N) electrically coupled to the MLC current mirror input node 402, a driver node 220(1)-220(N) electrically coupled to the MLC driver node 404, and a current output node 210(1)-210(N) electrically coupled to the MLC current output node 406. Further, each SRAM bit cell 200(1)-200(N) is configured to store a binary data value as described with reference to FIG. 2, wherein the multi-bit value corresponding to the binary data value stored in the SRAM bit cells 200(1)-200(N) serves as the first operand in a multiplication operation performed by the MLC SRAM cell 400. The voltage VM applied to the MLC current mirror input node 402 is an analog representation of a multi-bit value that serves as a second operand in the multiplication operation performed by the MLC SRAM cell 400. As also previously described, the read port 202(1)-202(N) of each SRAM bit cell 200(1)-200(N) can cause current I(1)-I(N) to flow to a corresponding current sum line ISUM(1)-ISUM(N) based on the binary data value stored in the corresponding SRAM bit cell 200(1)-200(N), the voltage VD applied by the driver circuit 226, and the voltage VM applied to the MLC current mirror input node 402.

With continuing reference to FIGS. 4A and 4B, for each SRAM bit cell 200(1)-200(N), if a particular binary data value is stored in the SRAM bit cell 200(1)-200(N), a current I(1)-I(N) correlating to the voltage VM of a current mirror input node 214(1)-214(N) is added to the total current I(T) on the MLC current sum line MLC ISUM. As a result, the magnitude of the current I(T) on the MLC current sum line MLC ISUM is an analog representation of the first operand (e.g., the multi-bit value stored in the MLC SRAM cell 400) multiplied by the second operand (e.g., the multi-bit value corresponding to the voltage VM applied by the current mirror circuit 216). In this aspect, the total current I(T) on the MLC current sum line MLC ISUM is provided to an analog-to-digital converter (ADC) 408 configured to convert the total current I(T) of the MLC current sum line MLC ISUM to a digital output value DOUT. In particular, the ADC 408 includes an input node 410 electrically coupled to the MLC current sum line MLC ISUM, and an output node 412 configured to provide the digital output value DOUT. Employing the configuration above allows the MLC SRAM cell 400 to perform a multiplication operation, rather than sensing the stored binary data values and providing the binary data values to a separate multiplication circuit. Thus, the MLC SRAM cell 400 can be employed to perform multiplication operations while consuming less area and power.

With continuing reference to FIGS. 4A and 4B, details of a multiplication operation performed by the MLC SRAM cell 400 are now provided. More specifically, to perform a multiplication operation of the first operand (i.e., the multi-bit value stored in the MLC SRAM cell 400) multiplied by the second operand (i.e., the multi-bit value corresponding to the voltage VM applied by the current mirror circuit 216), a write operation is performed to store a multi-bit value of the first operand in the MLC SRAM cell 400. For example, if the first operand has a multi-bit value of three (3) (e.g., a binary value 11) and the MLC SRAM cell 400 includes three (3) SRAM bit cells 200(1)-200(3) each of which employs the second transistor 206(2) as an NMOS transistor, then the MLC SRAM cell 400 employs negative logic. Thus, in this example, the first operand of three (3) (e.g., a binary value 11) is stored in the MLC SRAM cell 400 by writing a logic '0' to the SRAM bit cells 200(1)-200(2), and writing a logic '1' to the SRAM bit cell 200(3) (e.g., the MLC SRAM cell 400 stores '001'). However, in aspects wherein each SRAM bit cell 200(1)-200(3) employs the second transistor 206(2) as a PMOS transistor, the MLC SRAM cell 400 employs positive logic such that the first operand of three (3) is stored by writing a logic '1' to the SRAM bit cells 200(1)-200(2), and writing a logic '0' to the SRAM bit cell 200(3) (e.g., the MLC SRAM cell 400 stores '110'). Further, if the second operand has a multi-bit value six (6), then a voltage VM that is an analog representation of the multi-bit value of six (6) is applied by the current mirror circuit 216 to the MLC current mirror input node 402, and the driver circuit 226 applies a voltage VD to the MLC driver node 404. In the aspect employing negative logic, a logic '1' is applied to the gate node 222 (not shown) of the second transistor 206(2) (not shown) of each SRAM bit cell 200(1)-200(2), which activates the second transistor 206(2) (e.g., an NMOS transistor) in each SRAM bit cell 200(1)-200(2) such that the current I(1)-I(2) flows from the MLC driver node 404 to each current output node 210(1)-210(2) through the SRAM bit cell 200(1)-200(2). Alternatively, in the aspect employing positive logic, a logic '0' is applied to the gate node 222 (not shown) of the second transistor 206(2) (e.g., a PMOS transistor) of each SRAM bit cell 200(1)-200(2) such that the current I(1)-I(2) flows from the MLC driver node 404 to each current output node 210(1)-210(2) through the SRAM bit cell 200(1)-200(2).

With continuing reference to FIGS. 4A and 4B, as a result of such coupling, each current I(1)-I(3) corresponding to the SRAM bit cells 200(1)-200(3) combines on the MLC current output node 406, and thus on the MLC current sum line MLC ISUM. The magnitude of the total current I(T) on the MLC current sum line MLC ISUM is an analog representation of the product of the first operand multiplied by the second operand. Thus, in this example, the magnitude of the total current I(T) on the MLC current sum line MLC ISUM is equivalent to the multi-bit value eighteen (18) (i.e., 6×3, which is the value of the voltage VM applied by the current mirror circuit 216 multiplied by the multi-bit value stored in the SRAM bit cells 200(1)-200(3)). Therefore, employing the configuration above allows the MLC SRAM cell 400 to perform a multiplication operation directly, rather than sensing the stored binary data values of the SRAM bit cells 200(1)-200(N) and providing the binary data to a separate multiplication circuit. As described in detail below, because the MLC SRAM cell 400 can perform a multiplication operation as described above, multiple instances of the MLC SRAM cell 400 can be employed to perform matrix multiplication while consuming less time, area, and power compared to systems that multiply matrices using conventional SRAM data arrays and multiplication circuits.

Figure 5:
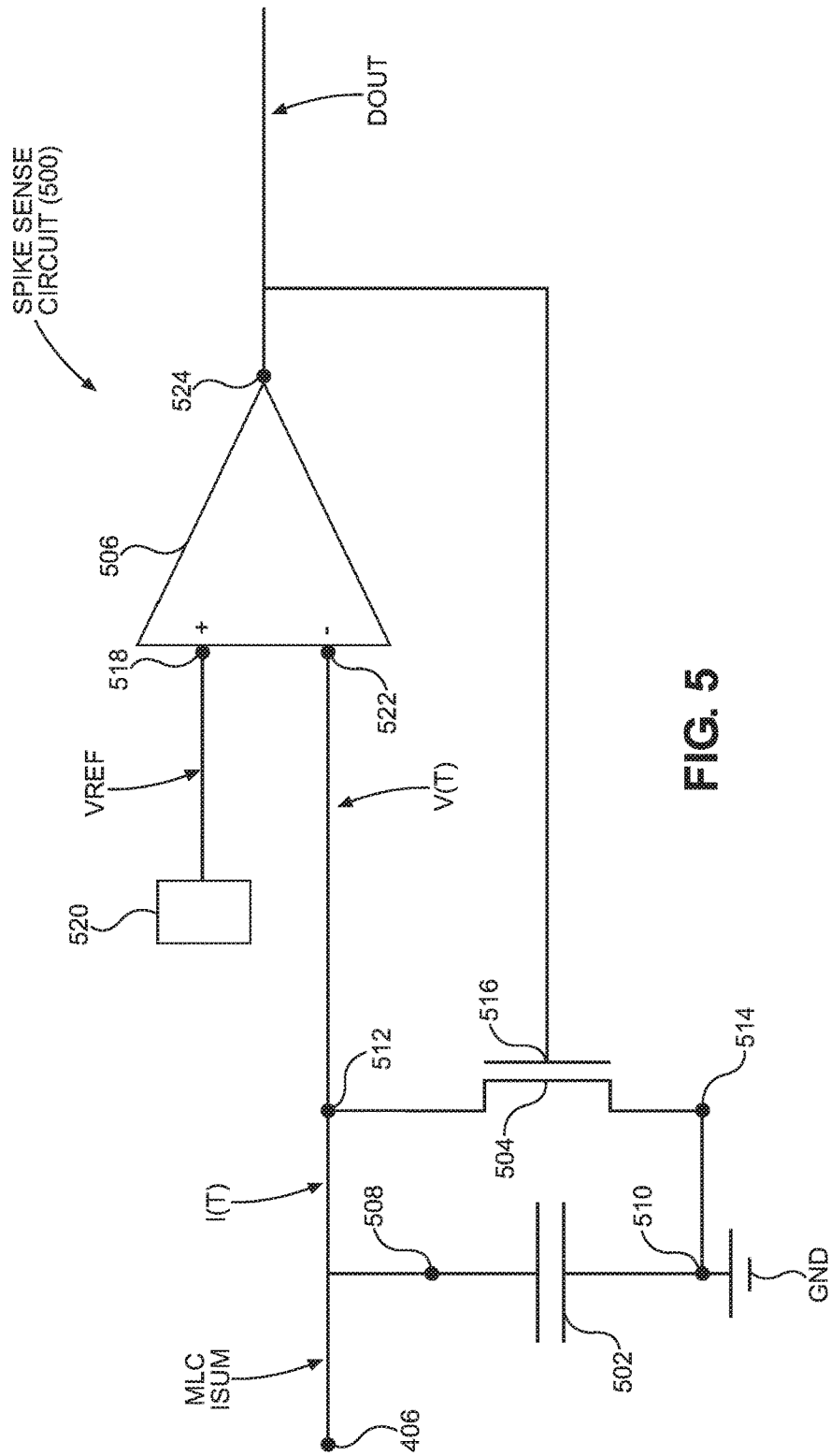
FIG. 5 is a circuit diagram of an exemplary spike sense circuit that can be used to convert an analog output value of the MLC SRAM cell of FIGS. 4A and 4B into a digital output value.

FIG. 5 illustrates a circuit diagram of an exemplary spike sense circuit 500 that can be used to convert an analog output value (i.e., the total current I(T)) of the MLC SRAM cell 400 of FIGS. 4A and 4B into the digital output value DOUT. In particular, the spike sense circuit 500 includes a capacitor 502, a transistor 504, and a comparator 506. The capacitor 502 includes a first node 508 electrically coupled to the MLC current output node 406, and a second node 510 electrically coupled to ground GND. The transistor 504 includes a first node 512 electrically coupled to the MLC current output node 406, a second node 514 electrically coupled to the second node 510 of the capacitor 502, and a gate node 516. The comparator 506 includes a first input node 518 electrically coupled to a reference voltage supply 520, a second input node 522 electrically coupled to the MLC current output node 406, and an output node 524 electrically coupled to the gate node 516. In this manner, the capacitor 502 functions to convert the total current I(T) on the MLC current sum line MLC ISUM into a corresponding voltage V(T), which is applied to the second input node 522. If the voltage V(T) is greater than a reference voltage VREF of the reference voltage supply 520, then the digital output value DOUT on the output node 524 is a logic '1.' However, if the voltage V(T) is less than the reference voltage VREF, then the digital output value DOUT on the output node 524 is a logic '0.'

Figure 6:
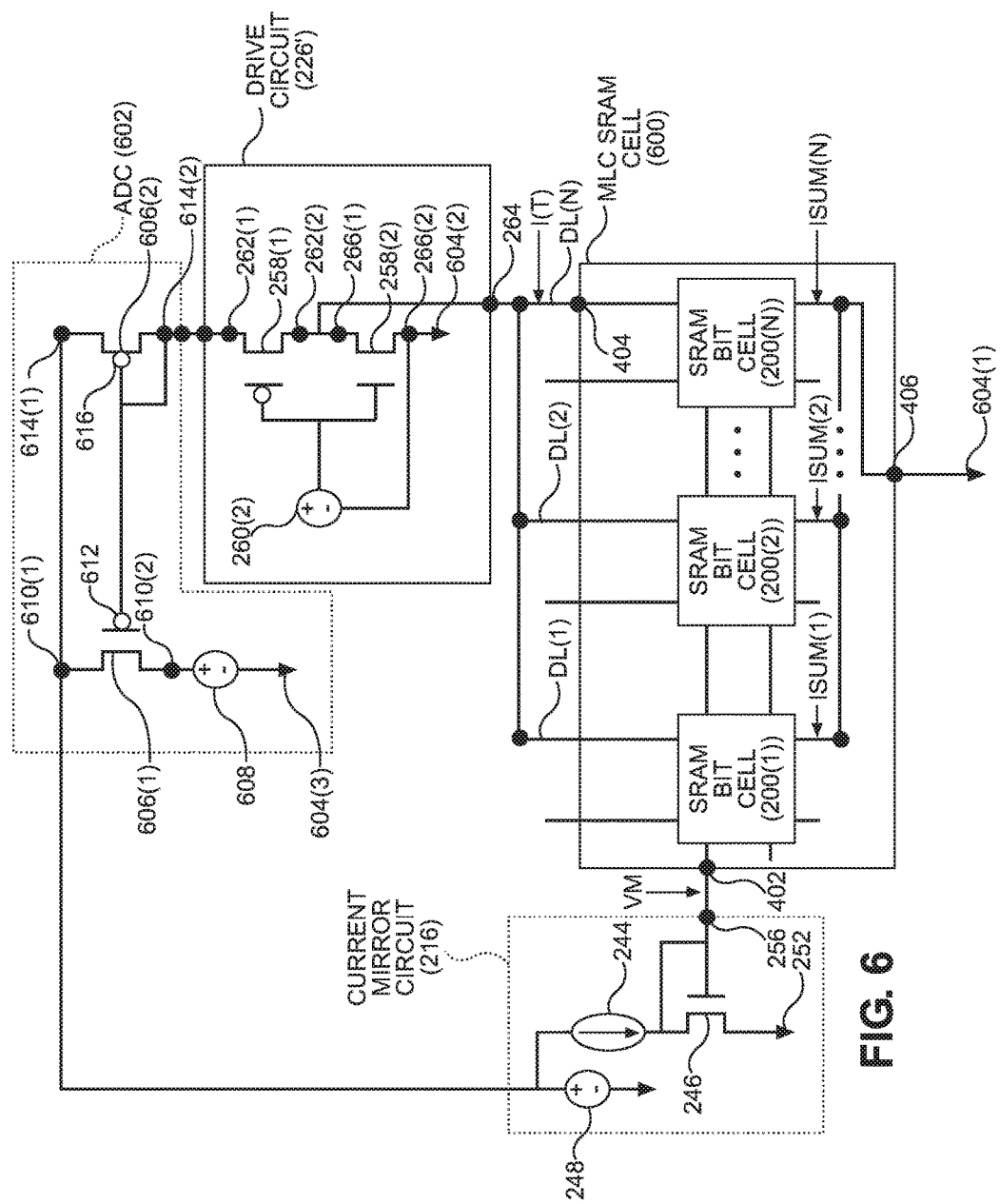
FIG. 6 is a circuit diagram of an exemplary MLC SRAM cell employing a current mirror circuit and driver circuit configured to sense a data value stored in the MLC SRAM cell.

FIG. 6 illustrates an exemplary MLC SRAM cell 600 employing an ADC 602 configured to sense a data value stored in the MLC SRAM cell 600. The MLC SRAM cell 600 includes common elements with the MLC SRAM cell 400 of FIGS. 4A and 4B, which are referred to with common element numbers in FIGS. 4A and 4B and FIG. 6, and thus will not re-described herein.

With continuing reference to FIG. 6, a current mirror circuit 216 is electrically coupled to an MLC current mirror input node 402 of the MLC SRAM cell 600. The MLC current output node 406 is electrically coupled to a ground source 604(1). Additionally, a driver circuit 226' is electrically coupled to an MLC driver node 404 of the MLC SRAM cell 600. The driver circuit 226' in this aspect includes a first transistor 258(1), a second transistor 258(2), and a voltage supply 260(2) similar to the driver circuit 226 in FIG. 2. However, in the driver circuit 226', the first transistor 258(1) includes a second node 262(2) electrically coupled to a first node 266(1) of the second transistor 258(2), wherein the second node 266(2) and the first node 266(1) are both electrically coupled to a driver output node 264 that is electrically coupled to the MLC current output node 406. A second node 266(2) of the second transistor 258(2) is electrically coupled to a ground source 604(2). Further, the ADC 602 includes a first transistor 606(1), a second transistor 606(2), and a current sense circuit 608. The current sense circuit 608 is also electrically coupled to a ground source 604(3). The first transistor 606(1) includes a first node 610(1) electrically coupled to a voltage supply 248, a second node 610(2) electrically coupled to the current sense circuit 608, and a gate node 612. The second transistor 606(2) includes a first node 614(1) electrically coupled to the first node 610(1), a second node 614(2) electrically coupled to a first node 262(1) of the first transistor 258(1), and a gate node 616 electrically coupled to the gate node 612 of the first transistor 606(1) and the second node 614(2) of the second transistor 606(2). Configuring the elements as described above results in a total current I(T) of the driver lines DL(1)-DL(N) representing a multi-bit data value stored in the MLC SRAM cell 600.

Figure 7:
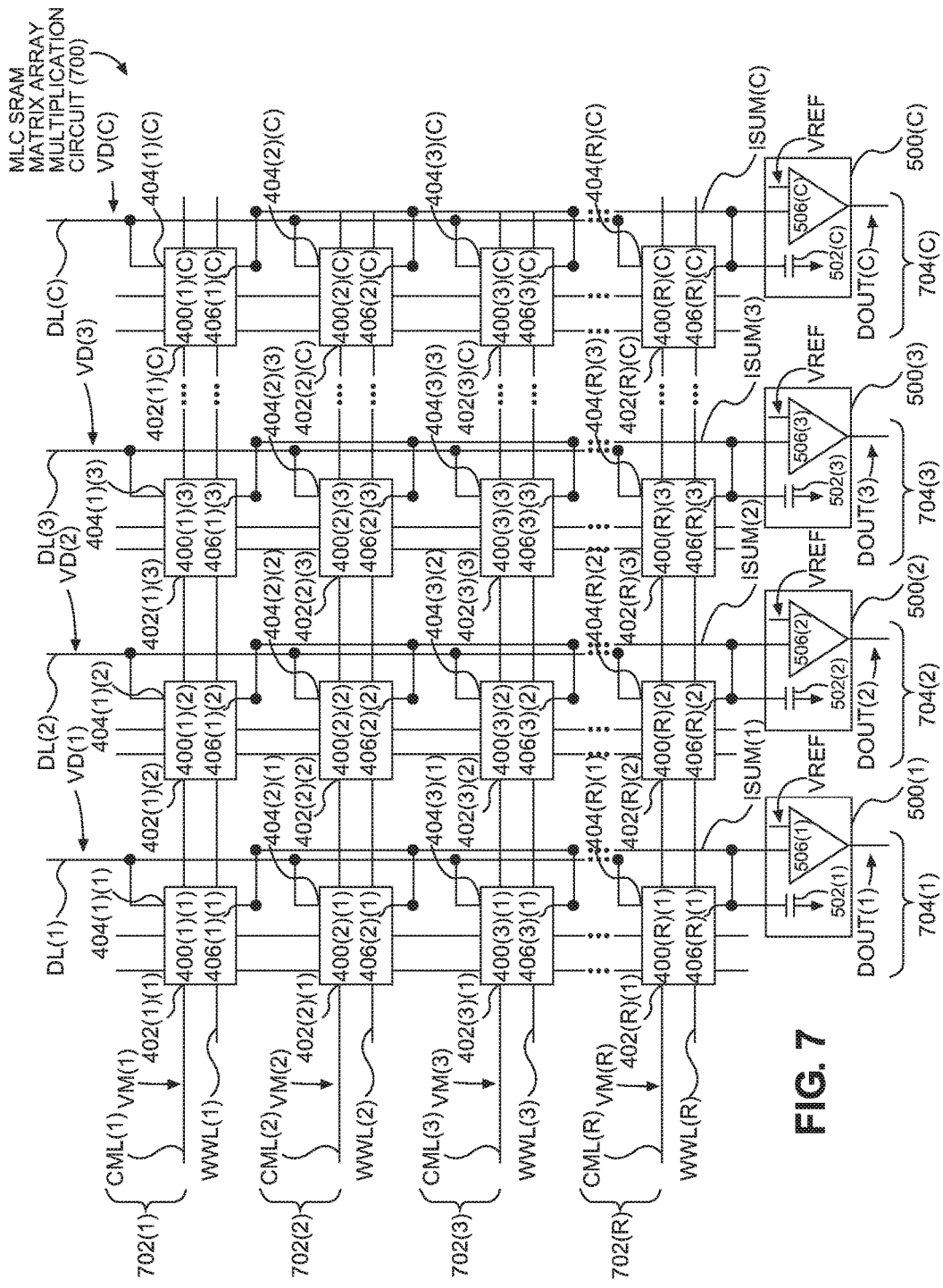
FIG. 7 is a block diagram of an exemplary MLC SRAM matrix array multiplication circuit configured to multiply a matrix stored in MLC SRAM cells of the MLC SRAM matrix array multiplication circuit by values input into the MLC SRAM matrix array multiplication circuit.

As referenced above, because the MLC SRAM cell 400 can perform a multiplication operation as described above, multiple instances of the MLC SRAM cell 400 can be employed to perform matrix multiplication while consuming less time, area, and power compared to systems that multiply matrices using conventional SRAM data arrays and multiplication circuits. In this regard, FIG. 7 illustrates a block diagram of an exemplary MLC SRAM matrix array multiplication circuit 700, wherein a matrix array stored in MLC SRAM cells 400(1)(1)-400(R)(C) of the MLC SRAM matrix array multiplication circuit 700 is multiplied by a multi-bit value correlating to a voltage VM(1)-VM(R) input into the MLC SRAM matrix array multiplication circuit 700. The MLC SRAM cells 400(1)(1)-400(R)(C) include common elements with the MLC SRAM cell 400 of FIG. 4, which are referred to with common element numbers in FIGS. 4A and 4B and FIG. 7, and thus will not re-described herein.

With continuing reference to FIG. 7, in this aspect, the MLC SRAM cells 400(1)(1)-400(R)(C) of the MLC SRAM matrix array multiplication circuit 700 are organized into MLC SRAM cell rows 702(1)-702(R) and MLC SRAM cell columns 704(1)-704(C). Each MLC SRAM cell 400(1)(1)-400(R)(C) corresponds to an MLC SRAM row 702(1)-702(R) and an MLC SRAM cell column 704(1)-704(C). Each MLC SRAM cell 400(1)(1)-400(R)(C) is configured to store a multi-bit data value corresponding to a location in the stored matrix, wherein each stored binary data value serves as a first operand in a matrix multiplication operation. For example, the MLC SRAM cell 400(1)(1) is configured to store the multi-bit data value of the first MLC SRAM cell row 702(1)/first MLC SRAM cell column 704(1) intersection in the stored matrix array. To store such values, each MLC SRAM column 704(1)-704(C) includes write bit lines WBL(1)-WBL(N) and complement write bit lines WBLC(1)-WBLC(N) corresponding to each SRAM bit cell 200(1)-200(N) (not shown) of each corresponding MLC SRAM cell 400(1)(1)-400(R)(C). Further, each MLC SRAM cell row 702(1)-702(R) includes a write word line WWL(1)-WWL(R) used for writing data values to the MLC SRAM cells 400(1)(1)-400(R)(C).

With continuing reference to FIG. 7, voltages VD(1)-VD(C) are applied to driver lines DL(1)-DL(C) of the MLC SRAM matrix array multiplication circuit 700. Each driver line DL(1)-DL(C) in this aspect corresponds to an MLC SRAM cell column 704(1)-704(C) such that each driver line DL(1)-DL(C) is electrically coupled to an MLC driver node 404(1)(1)-404(R)(C) of each MLC SRAM cell 400(1)(1)-400(R)(C) in the corresponding MLC SRAM cell column 704(1)-704(C). Other aspects may be configured such that each driver line DL corresponds to a different subset of the MLC SRAM cells 400(1)(1)-400(R)(C), such as to each MLC SRAM cell row 702(1)-702(R). Configuring the driver lines DL(1)-DL(C) in this manner allows for independent values correlating to each voltage VD(1)-VD(C) to be applied to each MLC SRAM cell column 704(1)-704(C). Additionally, voltages VM(1)-VM(R) applied to corresponding current mirror lines CML(1)-CML(R) corresponding to each MLC SRAM row 702(1)-702(R) are included, wherein currents correlating to the voltages VM(1)-VM(R) are used as a second operand to perform a matrix multiplication operation, similar to the current mirror line CML described with reference to FIGS. 4A and 4B.

With continuing reference to FIG. 7, the MLC SRAM matrix array multiplication circuit 700 also includes current sum lines ISUM(1)-ISUM(C). Each current sum line ISUM(1)-ISUM(C) corresponds to an MLC SRAM cell column 702(1)-702(C) such that each current sum line ISUM(1)-ISUM(C) is electrically coupled to an MLC current output node 406(1)(1)-406(R)(C) of each MLC SRAM cell 400(1)(1)-400(R)(C) in the corresponding MLC SRAM cell column 702(1)-702(C). Other aspects may be configured such that each current sum line ISUM corresponds to a different subset of the MLC SRAM cells 400(1)(1)-400(R)(C), such as to each MLC SRAM cell column 704(1)-704(C). By configuring each current sum line ISUM(1)-ISUM(C) in this manner, a current I(1)-I(C) on each current sum line ISUM(1)-ISUM(C) is an analog representation of the summation of each product of the first operand stored in each MLC SRAM cell 400(1)(1)-400(R)(C) on each corresponding MLC SRAM cell column 704(1)-704(C) and the second operand applied to each corresponding MLC current mirror line CML(1)-CML(R). In other words, the current I(1)-I(C) on each current sum line ISUM(1)-ISUM(C) is an analog representation of one entry in a matrix generated by multiplying the data values stored in a corresponding MLC SRAM cell column 702(1)-702(C) by voltages correlating to the voltages VM(1)-VM(R) input via the current sum lines CML(1)-CML(R) (e.g., the voltages VM(1)-VM(R) control how much current corresponding to the voltages VD(1)-VD(C) traverses to the current sum lines ISUM(1)-ISUM(C)). The MLC current output node 406(1)(1)-406(R)(C) of each MLC SRAM cell 400(1)(1)-400(R)(C) on a corresponding MLC SRAM cell column 704(1)-704(C) in this aspect is electrically coupled to a corresponding spike sense circuit 500(1)-500(C), wherein each spike sense circuit 500(1)-500(C) employs a corresponding capacitor 502(1)-502(C) and comparator 506(1)-506(C). A voltage of each corresponding current sum line ISUM(1)-ISUM(C) is applied to the corresponding capacitor 502(1)-502(C) and the corresponding comparator 506(1)-506(C), and a reference voltage VREF is applied to each comparator 506(1)-506(C). In this manner, each spike sense circuit 500(1)-500(C) generates a corresponding digital output value DOUT(1)-DOUT(C).

Figure 8:
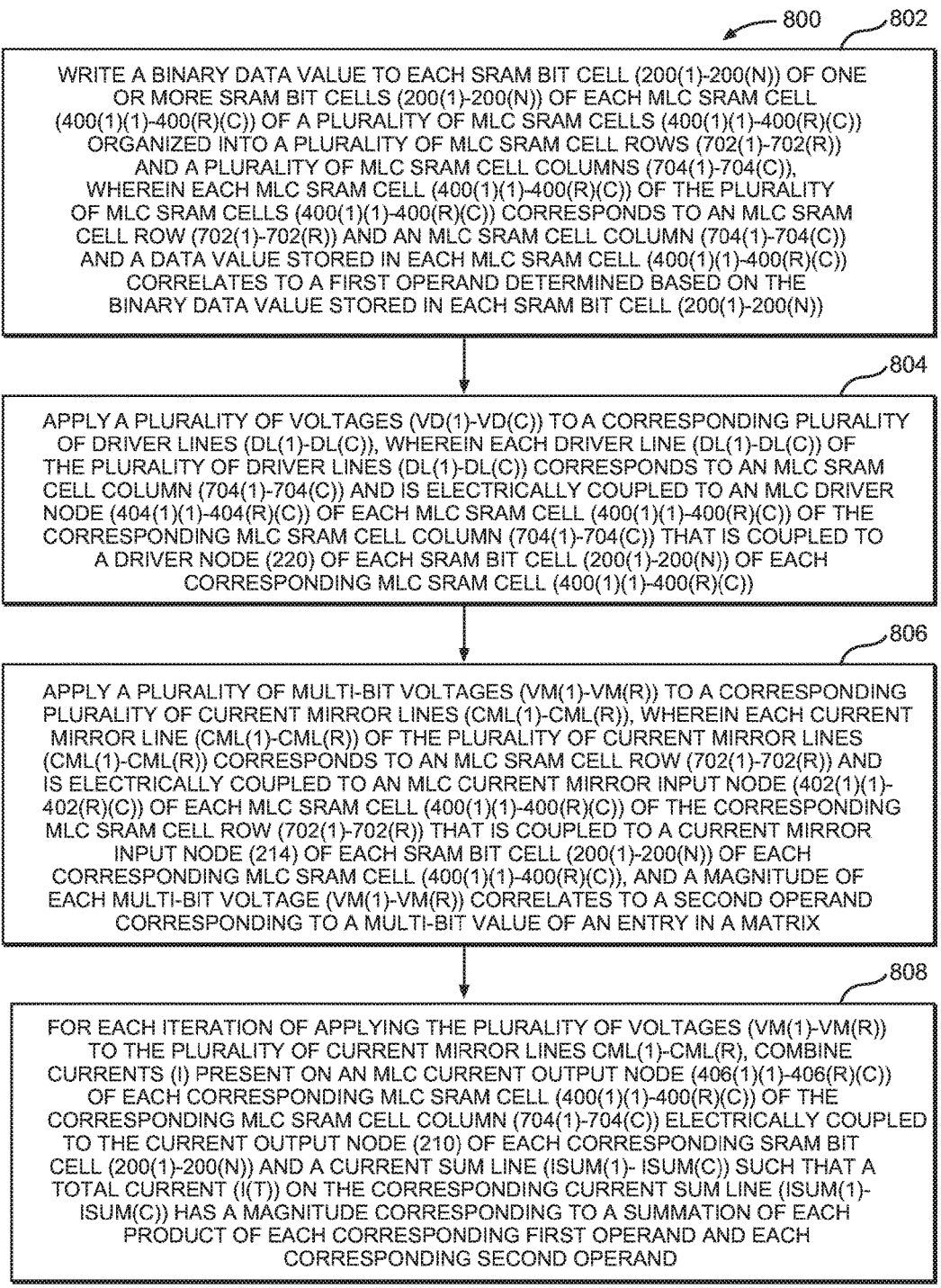
FIG. 8 is a flowchart illustrating an exemplary process for performing matrix multiplication using the MLC SRAM matrix array multiplication circuit of FIG. 7.

FIG. 8 illustrates an exemplary process 800 for performing a matrix multiplication operation using the MLC SRAM matrix array multiplication circuit 700 of FIG. 7. The process 800 includes writing a binary data value to each SRAM bit cell 200(1)-200(N) of each MLC SRAM cell 400(1)(1)-400(R)(C) organized into a plurality of MLC SRAM cell rows 702(1)-702(R) and a plurality of MLC SRAM cell columns 704(1)-704(C), wherein each MLC SRAM cell 400(1)(1)-400(R)(C) corresponds to an MLC SRAM cell row 702(1)-702(R) and an MLC SRAM cell column 704(1)-704(C) (block 802). A data value stored in each MLC SRAM cell 400(1)(1)-400(R)(C) correlates to a first operand determined based on the binary data value stored in each corresponding SRAM bit cell 200(1)-200(N). The process 800 also includes applying a plurality of voltages VD(1)-VD(C) to a corresponding plurality of driver lines DL(1)-DL(C) (block 804). In this aspect, each driver line DL(1)-DL(C) corresponds to an MLC SRAM cell column 704(1)-704(C) and is electrically coupled to an MLC driver node 404(1)(1)-404(R)(C) of each MLC SRAM cell 400(1)(1)-400(R)(C) of the corresponding MLC SRAM cell column 704(1)-704(C) that is coupled to a driver node 220 of each SRAM bit cell 200(1)-200(N) of each corresponding MLC SRAM cell 400(1)(1)-400(R)(C)). The process 800 also includes applying a plurality of multi-bit voltages VM(1)-VM(R) to a corresponding plurality of current mirror lines CML(1)-CML(R) using a corresponding current mirror circuit 216 (block 806). In this aspect, each current mirror line CML(1)-CML(R) corresponds to an MLC SRAM cell row 702(1)-702(R) and is electrically coupled to an MLC current mirror input node 402(1)(1)-402(R)(C) of each MLC SRAM cell 400(1)(1)-400(R)(C) of the corresponding MLC SRAM cell row 702(1)-702(R) that is coupled to a current mirror input node 214 of each SRAM bit cell 200(1)-200(N) of each corresponding MLC SRAM cell 400(1)(1)-400(R)(C)). Further, a magnitude of each multi-bit voltage VM(1)-VM(R) correlates to a second operand corresponding to a multi-bit value of an entry in a matrix. In this aspect, a level of the current I that is output onto a current output node 210 of each SRAM bit cell 200(1)-200(N) of each corresponding MLC SRAM cell 400(1)(1)-400(R)(C) correlates to a magnitude of the corresponding multi-bit voltage VM(1)-VM(R). The process 800 also includes, for each iteration of applying the plurality of voltages VM(1)-VM(R), combining currents I present on an MLC current output node 406(1)(1)-406(R)(C) of each corresponding MLC SRAM cell 400(1)(1)-400(R)(C) of the corresponding MLC SRAM cell column 704(1)-704(C) electrically coupled to the current output node 210 of each corresponding SRAM bit cell 200(1)-200(N) and a current sum line ISUM(1)-MLC ISUM(C) (block 808). In this manner, a total current I(T) on a corresponding current sum line ISUM(1)-MLC ISUM(C) has a magnitude corresponding to a summation of each product of each corresponding first operand and each corresponding second operand.

Figure 9:
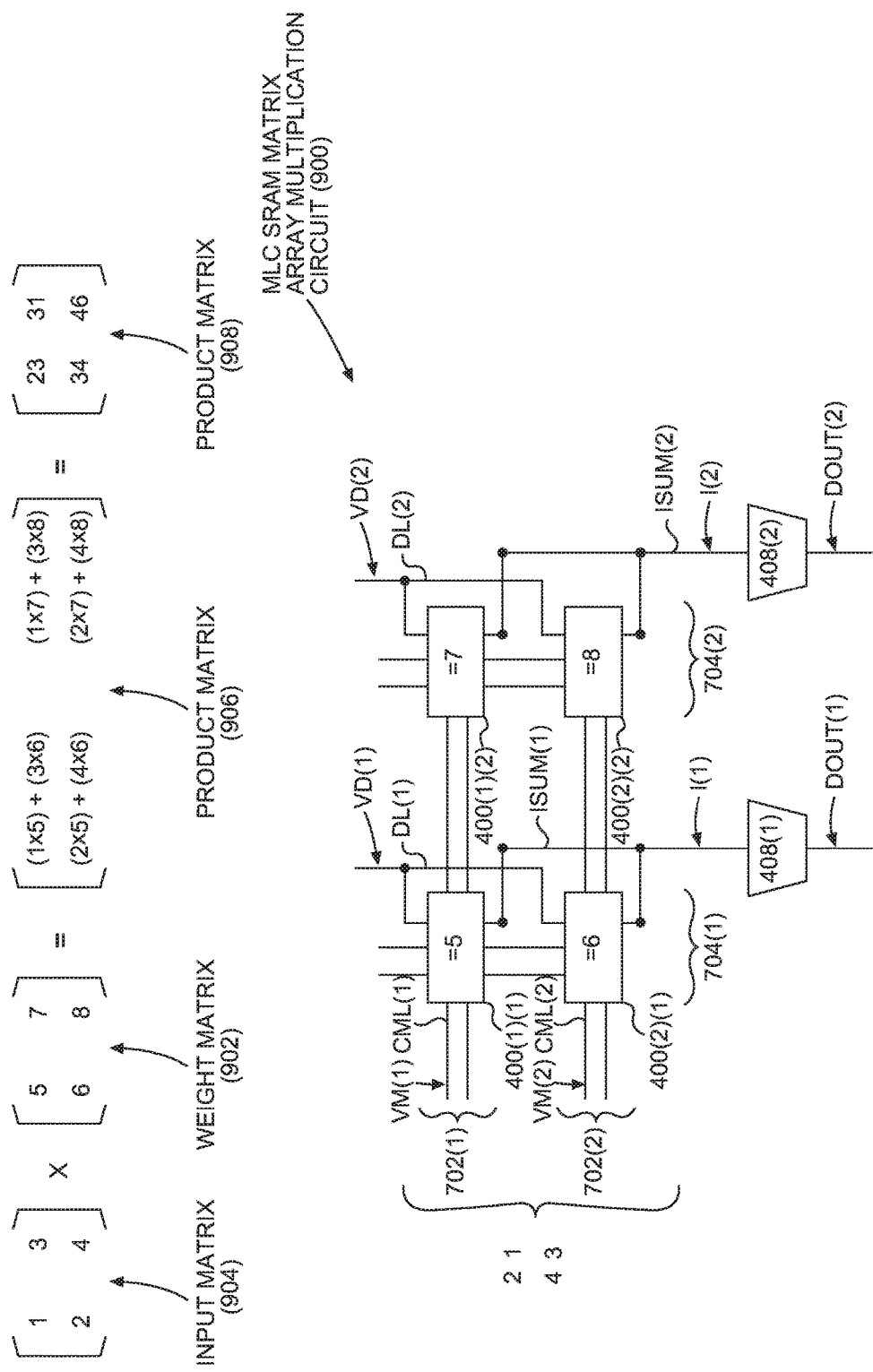
FIG. 9 is a diagram illustrating an exemplary matrix multiplication operation performed by an exemplary MLC SRAM matrix array multiplication circuit similar to the MLC SRAM matrix array multiplication circuit of FIG. 7.

To provide clarification of performing a matrix multiplication operation using the MLC SRAM matrix array multiplication circuit 700 of FIG. 7, details of an exemplary matrix array multiplication operation are now discussed. In this regard, FIG. 9 illustrates an exemplary MLC SRAM matrix array multiplication circuit 900 similar to the MLC SRAM matrix array multiplication circuit 700 of FIG. 7. The MLC SRAM matrix array multiplication circuit 900 includes common elements with the MLC SRAM matrix array multiplication circuit 700 of FIG. 7, which are referred to with common element numbers in FIG. 7 and FIG. 9, and thus will not re-described herein. In this regard, the MLC SRAM matrix array multiplication circuit 900 includes MLC SRAM cells 400(1)(1)-400(2)(2) organized into MLC SRAM cell rows 702(1), 702(2) and MLC SRAM cell columns 704(1),704(2). The MLC SRAM cells 400(1)(1)-400(2)(2) store multi-bit data values corresponding to a weight matrix 902. In particular, the MLC SRAM cell 400(1)(1) stores a multi-bit value of five (5), the MLC SRAM cell 400(1)(2) stores a multi-bit value of seven (7), the MLC SRAM cell 400(2)(1) stores a multi-bit value of six (6), and the MLC SRAM cell 400(2)(2) stores a multi-bit value of eight (8). It is assumed that the multi-bit values above were stored in the MLC SRAM cells 400(1)(1)-400(2)(2) using one or more write operations.

With continuing reference to FIG. 9, to multiply the weight matrix 902 stored in the MLC SRAM cells 400(1)(1)-400(2)(2) by an input matrix 904, voltages VM(1), VM(2) corresponding to multi-bit values from the input matrix 904 are applied to current mirror lines CML(1), CML(2) corresponding to the MLC SRAM cell rows 702(1), 702(2) of the MLC SRAM matrix array multiplication circuit 900. In particular, during a first iteration of inputting the voltages VM(1), VM(2), a multi-bit value of one (1) from a first column/first row entry of the input matrix 904 is applied to the current mirror line CML(1) using the voltage VM(1), and a multi-bit value three (3) from a first row/second column entry of the input matrix 904 is applied to the current mirror line CML(2) using the voltage VM(2). As a result, a magnitude of the current 41) on the current sum line ISUM(1) is an analog representation of twenty-three (23). In particular, applying the voltages VM(1), VM(2) described above results in the MLC SRAM matrix array multiplication circuit 900 performing the equation ((1×5)+(3×6)), as illustrated in product matrix 906, wherein the result of a multi-bit value of twenty-three (23) is illustrated in a first row/first column entry of a product matrix 908. Additionally, a magnitude of the current I(2) on the current sum line ISUM(2) is an analog representation of thirty-one (31). In particular, applying the voltages VM(1), VM(2) described above results in the MLC SRAM matrix array multiplication circuit 900 performing the equation ((1×7)+(3×8)), as illustrated in product matrix 906, wherein the result of a multi-bit value of thirty-one (31) is illustrated in a first row/second column entry of the product matrix 908.

With continuing reference to FIG. 9, during a second iteration of inputting the voltages VM(1), VM(2), a multi-bit value two (2) from a second row/first column entry of the input matrix 904 is applied to the current mirror line CML(1), and a multi-bit value of four (4) from a second row/second column entry of the input matrix 904 is applied to the current mirror line CML(2). As a result, the magnitude of the current 41) on the current sum line ISUM(1) is an analog representation of thirty-four (34). In particular, applying the voltages V(1), V(2) described above results in the MLC SRAM matrix array multiplication circuit 900 performing the equation ((2×5)+(4×6)), as illustrated in the product matrix 906, wherein the result of thirty-four (34) is illustrated in a second row/first column entry of the product matrix 908. Additionally, the magnitude of the current I(2) on the current sum line ISUM(2) is an analog representation of forty-six (46). In particular, applying the voltages VM(1), VM(2) described above results in the MLC SRAM matrix array multiplication circuit 900 performing the equation ((2×7)+(4×8)), as illustrated in product matrix 906, wherein the result of forty-six (46) is illustrated in a second row/second column entry of the product matrix 908. Further, ADCs 408(1), 408(2) are electrically coupled to the corresponding MLC current output nodes 406(1)(1), 406(2)(2) (not shown) such that the corresponding currents I(1), I(2) may be converted into digital output values DOUT(1), DOUT(2), as previously described with reference to FIGS. 2A and 2B.

With continuing reference to FIG. 9, in summary, during the first iteration of applying voltages VM(1), VM(2), the MLC SRAM matrix array multiplication circuit 900 multiplies the first operand stored in the MLC SRAM cells 400(1)(1), 400(2)(1) by the second operand applied to the corresponding current mirror lines CML(1), CML(2), and adds the products together on the current sum line ISUM(1). Additionally during the first iteration of applying voltages VM(1), VM(2), the MLC SRAM matrix array multiplication circuit 900 multiplies the first operand stored in the MLC SRAM cells 400(1)(2), 400(2)(2) by the second operand applied to the corresponding current mirror lines CML(1), CML(2), and adds the products together on the current sum line ISUM(2). The MLC SRAM matrix array multiplication circuit 900 performs similar functions for the second operands applied during the second iteration of inputting the voltages VM(1), VM(2). In this manner, the MLC SRAM matrix array multiplication circuit 900 performs matrix multiplication of the weight matrix 902 and the input matrix 904 to calculate the product matrix 908 without employing sense circuits or multiplication circuits in addition to the MLC SRAM cells 400(1)(1)-400(2)(2).

Figure 10:
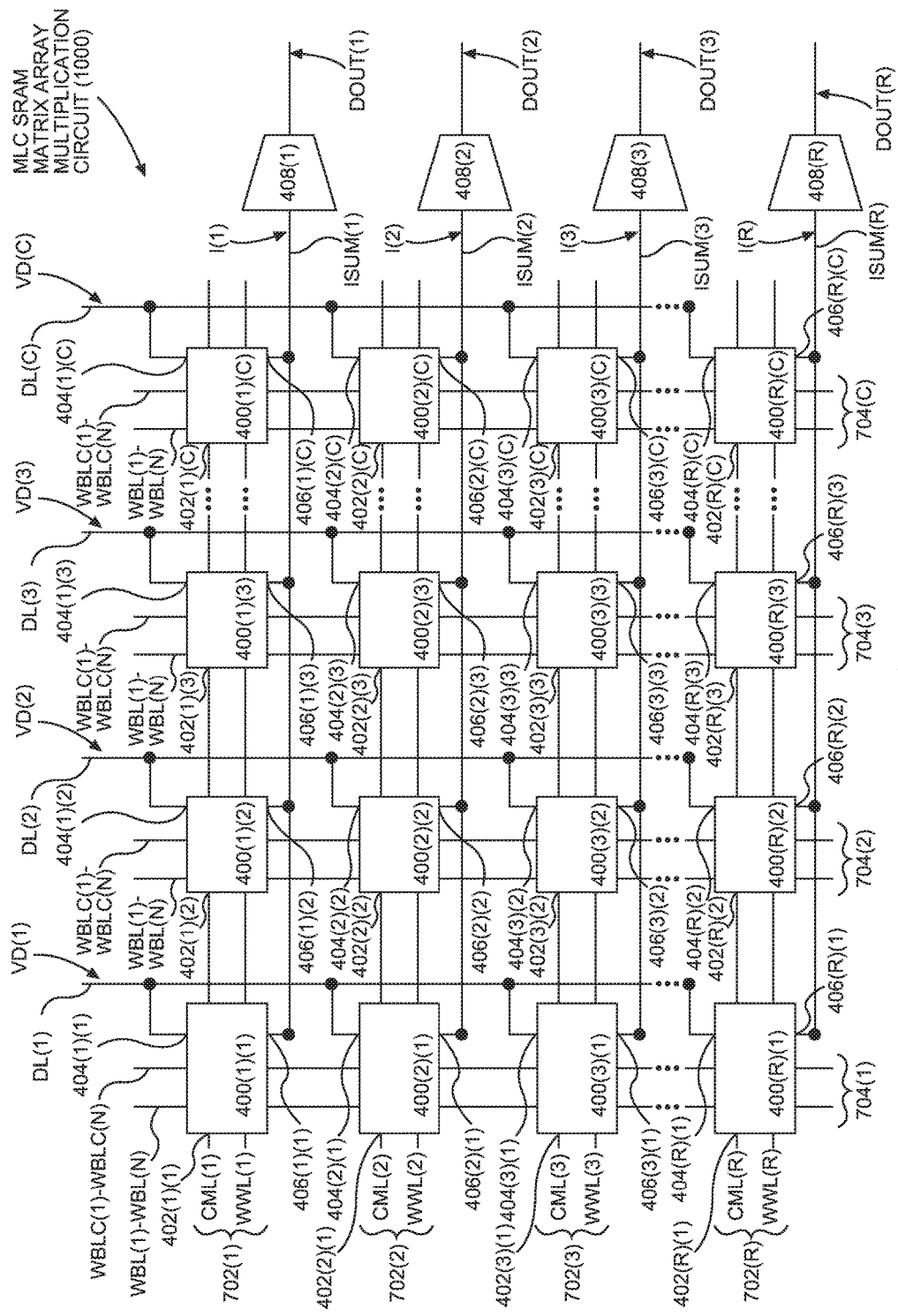
FIG. 10 is a block diagram of another exemplary MLC SRAM matrix array multiplication circuit configured to multiply a matrix stored in MLC SRAM cells of the MLC SRAM matrix array multiplication circuit by values input into the MLC SRAM matrix array multiplication circuit.

As noted above, in addition to the MLC SRAM matrix array multiplication circuit 700 of FIG. 7, other aspects may be configured such that each current sum line ISUM or driver line DL corresponds to a different subset of the MLC SRAM cells 400(1)(1)-400(R)(C). In this regard, FIG. 10 illustrates another exemplary MLC SRAM matrix array multiplication circuit 1000, wherein a matrix array stored in MLC SRAM cells 400(1)(1)-400(R)(C) of the MLC SRAM matrix array multiplication circuit 1000 is multiplied by a binary value correlating to a voltage VD(1)-VD(C) input into the MLC SRAM matrix array multiplication circuit 1000. The MLC SRAM matrix array multiplication circuit 1000 includes common elements with the MLC SRAM matrix array multiplication circuit 700 of FIG. 7, which are referred to with common element numbers in FIG. 7 and FIG. 10, and thus will not re-described herein. In this manner, multi-bit data values stored in each MLC SRAM cell 400(1)(1)-400(R)(C) serve as a first operand for a matrix multiplication operation, while voltages VM(1)-VM(R) corresponding to a second operand are applied to MLC current mirror lines CML(1)-CML(R) of the MLC SRAM matrix array multiplication circuit 1000. However, the MLC SRAM matrix array multiplication circuit 1000 includes current sum lines ISUM(1)-ISUM(R) that correspond to each MLC SRAM cell row 702(1)-702(R) rather than to each MLC SRAM cell column 704(1)-704(C). This configuration provides designers with another option to achieve matrix multiplication according to aspects described herein while consuming less power and area compared to conventional circuits.

Figure 11:
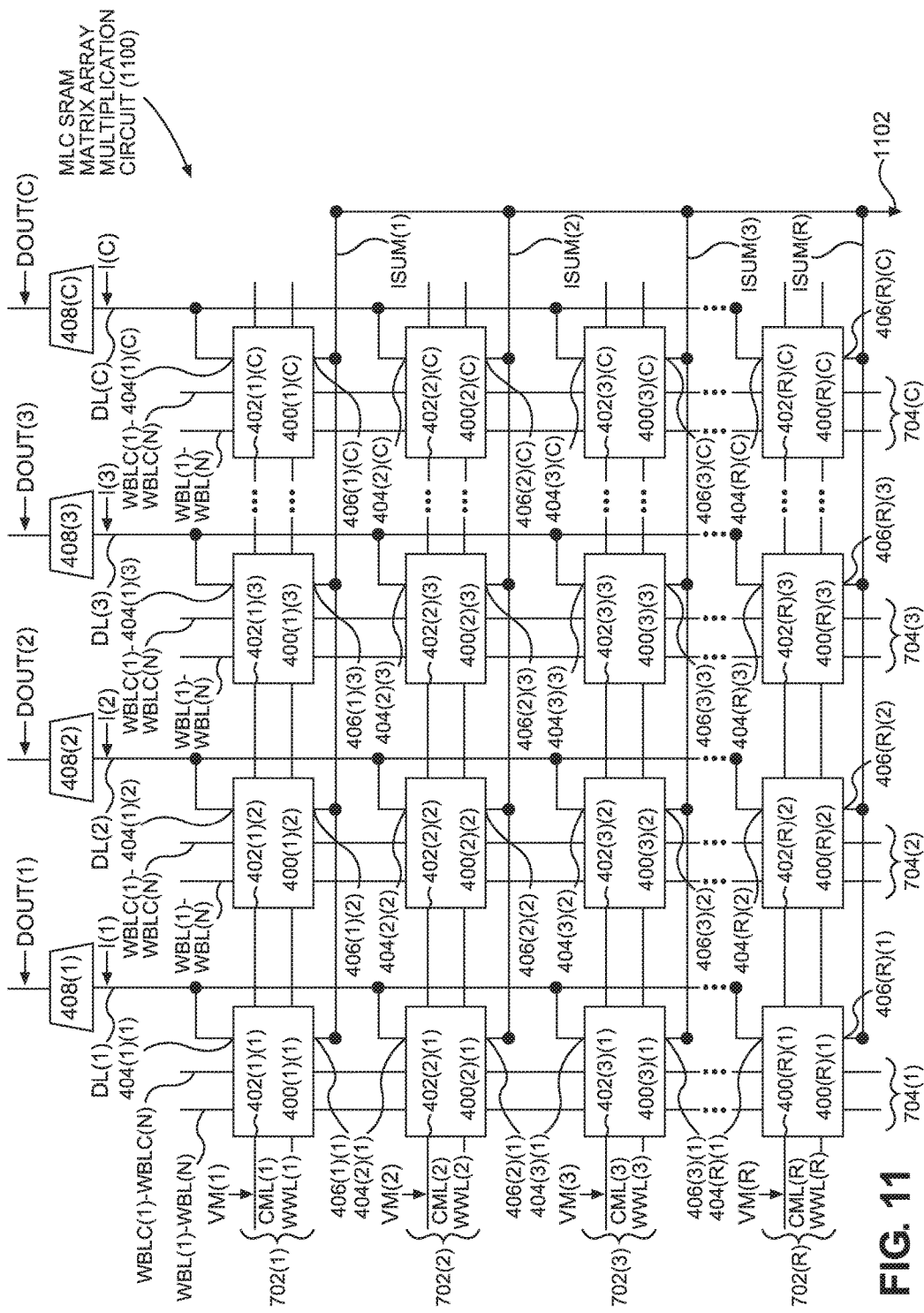
FIG. 11 is a block diagram of another exemplary MLC SRAM matrix array multiplication circuit configured to multiply a matrix stored in MLC SRAM cells of the MLC SRAM matrix array multiplication circuit by values input into the MLC SRAM matrix array multiplication circuit.

Additionally, FIG. 11 illustrates another exemplary MLC SRAM matrix array multiplication circuit 1100, wherein a matrix array stored in MLC SRAM cells 400(1)(1)-400(R)(C) of the MLC SRAM matrix array multiplication circuit 1100 is multiplied by a value correlating to a voltage VM(1)-VM(R) input into the MLC SRAM matrix array multiplication circuit 1100. The MLC SRAM matrix array multiplication circuit 1100 includes common elements with the MLC SRAM matrix array multiplication circuit 700 of FIG. 7, which are referred to with common element numbers in FIG. 7 and FIG. 11, and thus will not re-described herein. In this manner, multi-bit data values stored in each MLC SRAM cell 400(1)(1)-400(R)(C) serve as a first operand for a matrix multiplication operation. However, voltages VM(1)-VM(R) corresponding to a second operand are applied to each current mirror line CML(1)-CML(R) of the MLC SRAM matrix array multiplication circuit 1100. Additionally, the MLC SRAM matrix array multiplication circuit 1100 includes current sum lines ISUM(1)-ISUM(R) electrically coupled to a ground source 1102, wherein the current I(1)-I(C) on each driver line DL(1)-DL(C) corresponding to each MLC SRAM cell column 704(1)-704(C) represents the product of the matrix multiplication operation. This configuration provides designers with another option to achieve matrix multiplication according to aspects described herein while consuming less power and area compared to conventional circuits.

The SRAM bit cells employing current mirror-gated read ports for reduced power consumption according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
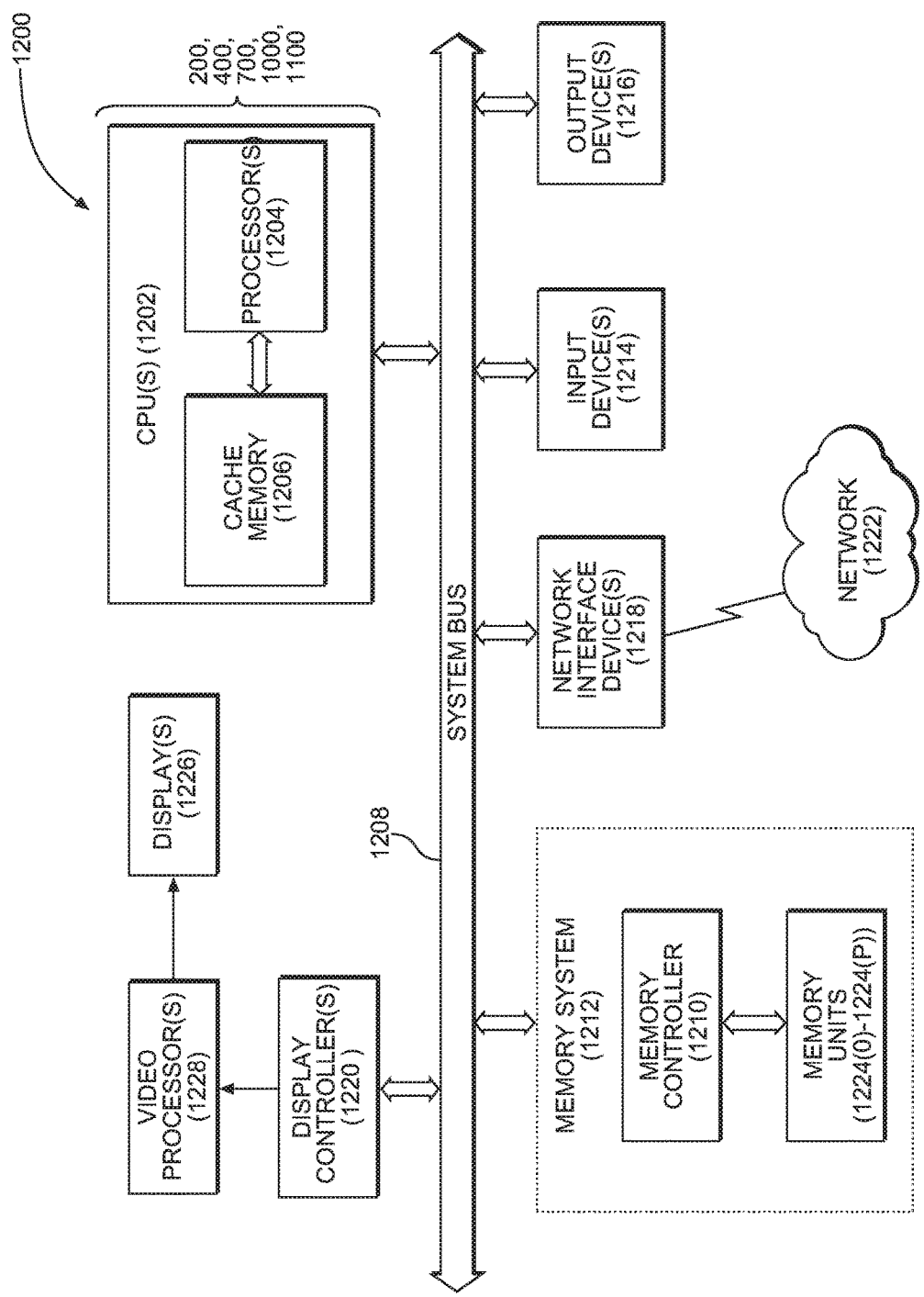
FIG. 12 is a block diagram of an exemplary processor-based system that can include elements employing the SRAM bit cell of FIGS. 2A and 2B, the MLC SRAM cell of FIG. 4A, and/or the MLC SRAM matrix array multiplication circuits of FIGS. 7, 10, and 11.

In this regard, FIG. 12 illustrates an example of a processor-based system 1200 that can include elements employing the SRAM bit cell 200 of FIGS. 2A and 2B, the MLC SRAM cell 400 of FIG. 4A, and/or the MLC SRAM matrix array multiplication circuits 700, 1000, and 1100 of FIGS. 7, 10, and 11, respectively. In this example, the processor-based system 1200 includes one or more central processing units (CPUs) 1202, each including one or more processors 1204. The CPU(s) 1202 may have cache memory 1206 coupled to the processor(s) 1204 for rapid access to temporarily stored data. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212, one or more input devices 1214, one or more output devices 1216, one or more network interface devices 1218, and one or more display controllers 1220, as examples. The input device(s) 1214 can include any type of input device, including, but not limited to, input keys, switches, voice processors, etc. The output device(s) 1216 can include any type of output device, including, but not limited to, audio, video, other visual indicators, etc. The network interface device(s) 1218 can be any device configured to allow exchange of data to and from a network 1222. The network 1222 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1218 can be configured to support any type of communications protocol desired. The memory system 1212 can include one or more memory units 1224(0)-1224(P).

The CPU(s) 1202 may also be configured to access the display controller(s) 1220 over the system bus 1208 to control information sent to one or more displays 1226. The display controller(s) 1220 sends information to the display(s) 1226 to be displayed via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, a light emitting diode (LED) display, etc.

Figure 13:
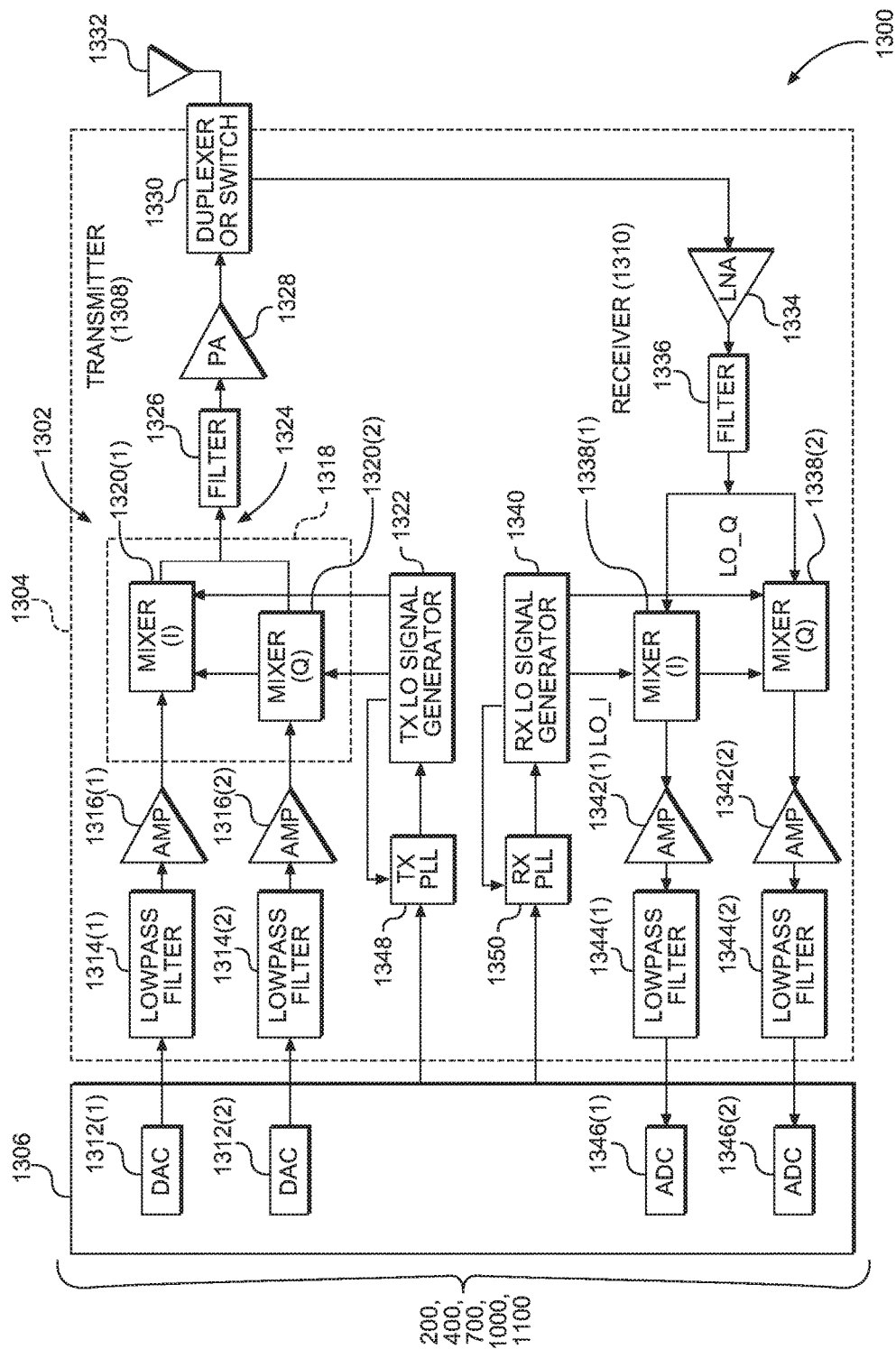
FIG. 13 is a block diagram of an exemplary wireless communications device that includes radio frequency (RF) components formed in an integrated circuit (IC), wherein the RF components can include elements employing the SRAM bit cell of FIGS. 2A and 2B, the MLC SRAM cell of FIG. 4A, and/or the MLC SRAM matrix array multiplication circuits of FIGS. 7, 10, and 11.

FIG. 13 illustrates an exemplary wireless communications device 1300 that includes radio frequency (RF) components formed in an integrated circuit (IC) 1302, wherein the RF components can include elements employing the SRAM bit cell 200 of FIGS. 2A and 2B, the MLC SRAM cell 400 of FIG. 4A, and/or the MLC SRAM matrix array multiplication circuits 700, 1000, and 1100 of FIGS. 7, 10, and 11, respectively. In this regard, the wireless communications device 1300 may be provided in the IC 1302. The wireless communications device 1300 may include or be provided in any of the above referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMP) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by amplifiers (AMP) 1342(1), 1342(2) and further filtered by lowpass filters 1344(1), 1344(2) to obtain I and Q analog input signals, which are provided to the data processor 1306. In this example, the data processor 1306 includes ADCs 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) bit cell, comprising:
    a current mirror input node;
    a driver node;
    a current output node electrically coupled to a current sum line;
    a first inverter and a second inverter cross-coupled to and configured to store a binary data value;
    a read port, comprising:
        a first transistor, comprising:
            a first node electrically coupled to the current output node;
            a second node; and
            a gate node electrically coupled to the current mirror input node that is electrically coupled to a current mirror circuit configured to apply a voltage to the gate node of the first transistor, wherein a level of current that flows from the second node of the first transistor to the first node of the first transistor correlates to a magnitude of the voltage; and
        a second transistor, comprising:
            a first node electrically coupled to the second node of the first transistor;
            a second node electrically coupled to the driver node that is electrically coupled to a driver circuit configured to apply a voltage to the second node of the second transistor; and
            a gate node electrically coupled to an output node of the first inverter and
    a spike sense circuit, comprising:
        a capacitor, comprising:
            a first node electrically coupled to the current sum line; and
            a second node electrically coupled to ground;
        a transistor, comprising:
            a first node electrically coupled to the current sum line; and
            a second node electrically coupled to the second node of the capacitor;
            a gate node; and
        a comparator, comprising:
            a first input node electrically coupled to a reference voltage supply;
            a second input node electrically coupled to the current sum line; and
            an output node electrically coupled to the gate node of the transistor.

2. The SRAM bit cell of claim 1, further comprising:
    a first access transistor, comprising:
        a first node electrically coupled to a write bit line;
        a second node electrically coupled to an input node of the first inverter and an output node of the second inverter; and
        a gate node electrically coupled to a write word line; and
    a second access transistor, comprising:
        a first node electrically coupled to the output node of the first inverter and an input node of the second inverter;
        a second node electrically coupled to a complement write bit line; and
        a gate node electrically coupled to the write word line.

3. The SRAM bit cell of claim 1, wherein:
    the first transistor is an N-type metal-oxide semiconductor (MOS) (NMOS) transistor; and
    the second transistor is an NMOS transistor.

4. The SRAM bit cell of claim 1, wherein:
    the first transistor is an NMOS transistor; and
    the second transistor is a P-type MOS (PMOS) transistor.

5. The SRAM bit cell of claim 1, wherein:
    the first transistor is a PMOS transistor; and
    the second transistor is an NMOS transistor.

6. The SRAM bit cell of claim 1, wherein:
    the first transistor is a PMOS transistor; and
    the second transistor is a PMOS transistor.

7. The SRAM bit cell of claim 1,
    wherein the current output node is electrically coupled to a ground source, and the SRAM bit cell further comprises an analog-to-digital converter (ADC) circuit configured to convert a total current on the driver node into a digital output value and comprising:
        an input node electrically coupled to the driver circuit; and
        an output node configured to provide the digital output value.

8. The SRAM bit cell of claim 1,
    wherein the SRAM bit cell further comprises an ADC circuit configured to convert a total current on the current sum line into a digital output value and comprising:
        an input node electrically coupled to the current sum line; and
        an output node configured to provide the digital output value.

9. The SRAM bit cell of claim 1 integrated into an integrated circuit (IC).

10. The SRAM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A multi-level cell (MLC) static random access memory (SRAM) (MLC SRAM) cell, comprising:
   an MLC current mirror input node;
   an MLC driver node electrically coupled to a driver circuit configured to apply a voltage to the MLC driver node;
   an MLC current output node electrically coupled to an MLC current sum line; and
   one or more SRAM bit cells, wherein each SRAM bit cell of the one or more SRAM bit cells comprises:
      a current mirror input node electrically coupled to the MLC current mirror input node;
      a driver node electrically coupled to the MLC driver node;
      a current output node electrically coupled to the MLC current output node;
      a first inverter and a second inverter cross-coupled to and configured to store a binary data value; and
      a read port, comprising:
         a first transistor, comprising:
            a first node electrically coupled to the current output node of the corresponding SRAM bit cell;
            a second node; and
            a gate node electrically coupled to the current mirror input node of the corresponding SRAM bit cell, wherein:
               the MLC current mirror input node is electrically coupled to a current mirror circuit configured to apply a voltage to the gate node of the first transistor; and
               a level of current that flows from the second node of the first transistor to the first node of the first transistor correlates to a magnitude of the voltage; and
         a second transistor, comprising:
            a first node electrically coupled to the second node of the first transistor;
            a second node electrically coupled to the corresponding driver node; and
            a gate node electrically coupled to an output node of the first inverter.

12. The MLC SRAM cell of claim 11, wherein each SRAM bit cell of the one or more SRAM bit cells further comprises:
   a first access transistor, comprising:
      a first node electrically coupled to a corresponding write bit line;
      a second node electrically coupled to an input node of the first inverter and an output node of the second inverter of the corresponding SRAM bit cell; and
      a gate node electrically coupled to a write word line; and
   a second access transistor, comprising:
      a first node electrically coupled to the output node of the first inverter and an input node of the second inverter of the corresponding SRAM bit cell;
      a second node electrically coupled to a corresponding complement write bit line; and
      a gate node electrically coupled to the write word line.

13. The MLC SRAM cell of claim 11, wherein:
   the first transistor is an N-type metal-oxide semiconductor (MOS) (NMOS) transistor; and
   the second transistor is an NMOS transistor.

14. The MLC SRAM cell of claim 11, wherein:
   the first transistor is an NMOS transistor; and
   the second transistor is a P-type MOS (PMOS) transistor.

15. The MLC SRAM cell of claim 11, wherein:
   the first transistor is a PMOS transistor; and
   the second transistor is an NMOS transistor.

16. The MLC SRAM cell of claim 11, wherein:
   the first transistor is a PMOS transistor; and
   the second transistor is a PMOS transistor.

17. A multi-level cell (MLC) static random access memory (SRAM) (MLC SRAM) matrix array multiplication circuit, comprising:
   a plurality of MLC SRAM cells organized into a plurality of MLC SRAM cell rows and a plurality of MLC SRAM cell columns, wherein each MLC SRAM cell of the plurality of MLC SRAM cells corresponds to an MLC SRAM cell row and an MLC SRAM cell column, and comprises:
      an MLC current mirror input node;
      an MLC driver node electrically coupled to a driver circuit configured to apply a voltage to the MLC driver node;
      an MLC current output node; and
      one or more SRAM bit cells, wherein each SRAM bit cell of the one or more SRAM bit cells comprises:
         a current mirror input node electrically coupled to the MLC current mirror input node;
         a driver node electrically coupled to the MLC driver node;
         a current output node electrically coupled to the MLC current output node;
         a first inverter and a second inverter cross-coupled to and configured to store a binary data value; and
         a read port, comprising:
            a first transistor, comprising:
               a first node electrically coupled to the current output node of the corresponding SRAM bit cell;
               a second node; and
               a gate node electrically coupled to the current mirror input node of the corresponding SRAM bit cell, wherein:
                  the MLC current mirror input node is electrically coupled to a current mirror circuit configured to apply a voltage to the gate node of the first transistor; and
                  a level of current that flows from the second node of the first transistor to the first node of the first transistor correlates to a magnitude of the voltage; and a second transistor, comprising:
a first node electrically coupled to the second node of the first transistor;
a second node electrically coupled to the corresponding driver node; and
a gate node electrically coupled to an output node of the first inverter;
a plurality of current sum lines, wherein each current sum line of the plurality of current sum lines is electrically coupled to the MLC current output node of each MLC SRAM cell of a corresponding subset of MLC SRAM cells of the plurality of MLC SRAM cells;
a plurality of driver lines, wherein each driver line of the plurality of driver lines is electrically coupled to the MLC driver node of each MLC SRAM cell of a corresponding subset of MLC SRAM cells of the plurality of MLC SRAM cells; and
a plurality of current mirror lines, wherein each current mirror line of the plurality of current mirror lines is electrically coupled to the MLC current mirror input node of each MLC SRAM cell of a corresponding subset of MLC SRAM cells of the plurality of MLC SRAM cells.

18. The MLC SRAM matrix array multiplication circuit of claim 17, wherein each SRAM bit cell of the one or more SRAM bit cells of the plurality of MLC SRAM cells further comprises:
a first access transistor, comprising:
a first node electrically coupled to a corresponding write bit line;
a second node electrically coupled to an input node of the first inverter and an output node of the second inverter of the corresponding SRAM bit cell; and
a gate node electrically coupled to a write word line; and
a second access transistor, comprising:
a first node electrically coupled to the output node of the first inverter and an input node of the second inverter of the corresponding SRAM bit cell;
a second node electrically coupled to a corresponding complement write bit line; and
a gate node electrically coupled to the write word line.

19. The MLC SRAM matrix array multiplication circuit of claim 17, wherein:
the corresponding subset of MLC SRAM cells to which each current sum line of the plurality of current sum lines is electrically coupled is a corresponding MLC SRAM cell column;
the corresponding subset of MLC SRAM cells to which each driver line of the plurality of driver lines is electrically coupled is a corresponding MLC SRAM cell column; and
the corresponding subset of MLC SRAM cells to which each current mirror line of the plurality of current mirror lines is electrically coupled is a corresponding MLC SRAM cell row.

20. The MLC SRAM matrix array multiplication circuit of claim 19, further comprising a plurality of analog-to-digital converter (ADC) circuits, wherein each ADC circuit is configured to convert a total current on a corresponding current sum line of the plurality of current sum lines into a digital output value and comprises:
an input node electrically coupled to the MLC current output node of each MLC SRAM cell of the corresponding MLC SRAM cell column; and
an output node configured to provide the digital output value.

21. The MLC SRAM matrix array multiplication circuit of claim 19, further comprising a plurality of spike sense circuits, wherein each spike sense circuit of the plurality of spike sense circuits corresponds to a current sum line of the plurality of current sum lines and comprises:
a capacitor, comprising:
a first node electrically coupled to the MLC current output node of each MLC SRAM cell of the corresponding MLC SRAM cell column; and
a second node electrically coupled to ground;
a transistor, comprising:
a first node electrically coupled to the MLC current output node of each MLC SRAM cell of the corresponding MLC SRAM cell column;
a second node electrically coupled to the second node of the capacitor; and
a gate node; and
a comparator, comprising:
a first input node electrically coupled to a reference voltage supply;
a second input node electrically coupled to the MLC current output node of each MLC SRAM cell of the corresponding MLC SRAM cell column; and
an output node electrically coupled to the gate node of the transistor of the spike sense circuit.

22. The MLC SRAM matrix array multiplication circuit of claim 17, wherein:
the corresponding subset of MLC SRAM cells to which each current sum line of the plurality of current sum lines is electrically coupled is a corresponding MLC SRAM cell row;
the corresponding subset of MLC SRAM cells to which each driver line of the plurality of driver lines is electrically coupled is a corresponding MLC SRAM cell column; and
the corresponding subset of MLC SRAM cells to which each current mirror line of the plurality of current mirror lines is electrically coupled is a corresponding MLC SRAM cell row.

23. The MLC SRAM matrix array multiplication circuit of claim 22, further comprising a plurality of analog-to-digital converter (ADC) circuits, wherein each ADC circuit is configured to convert a total current on a corresponding driver line of the plurality of driver lines into a digital output value and comprises:
an input node electrically coupled to the driver node of each MLC SRAM cell of the corresponding MLC SRAM cell row; and
an output node configured to provide the digital output value.

24. The MLC SRAM matrix array multiplication circuit of claim 22, further comprising a plurality of spike sense circuits, wherein each spike sense circuit of the plurality of spike sense circuits corresponds to a current sum line of the plurality of current sum lines and comprises:
a capacitor, comprising:
a first node electrically coupled to the MLC current output node of each MLC SRAM cell of the corresponding MLC SRAM cell row; and
a second node electrically coupled to ground;
a transistor, comprising:
a first node electrically coupled to the MLC current output node of each MLC SRAM cell of the corresponding MLC SRAM cell row;
a second node electrically coupled to the second node of the capacitor; and
a gate node; and a comparator, comprising:
  a first input node electrically coupled to a reference voltage supply;
  a second input node electrically coupled to the MLC current output node of each MLC SRAM cell of the corresponding MLC SRAM cell row; and
  an output node electrically coupled to the gate node of the transistor of the spike sense circuit.

25. A method of using a multi-level cell (MLC) static random access memory (SRAM) (MLC SRAM) matrix array multiplication circuit to multiply matrices, comprising:
  writing a binary data value to each SRAM bit cell of one or more SRAM bit cells of each MLC SRAM cell of a plurality of MLC SRAM cells organized into a plurality of MLC SRAM cell rows and a plurality of MLC SRAM cell columns, wherein each MLC SRAM cell of the plurality of MLC SRAM cells corresponds to an MLC SRAM cell row and an MLC SRAM cell column and a multi-bit data value stored in each MLC SRAM cell correlates to a first operand determined based on the binary data value stored in each SRAM bit cell;
  applying a plurality of voltages to a corresponding plurality of driver lines, wherein each driver line of the plurality of driver lines corresponds to an MLC SRAM cell column and is electrically coupled to an MLC driver node of each MLC SRAM cell of the corresponding MLC SRAM cell column that is coupled to a driver node of each SRAM bit cell of each corresponding MLC SRAM cell;
  applying a plurality of voltages to a corresponding plurality of current mirror lines, wherein each current mirror line of the plurality of current mirror lines corresponds to an MLC SRAM cell row and is electrically coupled to an MLC current mirror input node of each MLC SRAM cell of the corresponding MLC SRAM cell row that is coupled to a current mirror input node of each SRAM bit cell of each corresponding MLC SRAM cell, and a magnitude of each voltage correlates to a second operand corresponding to a value of an entry in a matrix; and
  for each iteration of applying the plurality of voltages to the plurality of current mirror lines, combining currents present on an MLC current output node of each corresponding MLC SRAM cell of the corresponding MLC SRAM cell column electrically coupled to a current output node of each corresponding SRAM bit cell and a current sum line such that a total current on the corresponding current sum line has a magnitude corresponding to a summation of each multi-bit product of each corresponding first operand and each corresponding second operand.

26. A static random access memory (SRAM) bit cell, comprising:
  a current mirror input node;
  a driver node;
  a current output node electrically coupled to a current sum line;
  a first inverter and a second inverter cross-coupled to and configured to store a binary data value; and
  a read port, comprising:
    a first transistor, comprising:
      a first node electrically coupled to the current output node;
      a second node; and
      a gate node electrically coupled to the current mirror input node that is electrically coupled to a current mirror circuit configured to apply a voltage to the gate node of the first transistor, wherein a level of current that flows from the second node of the first transistor to the first node of the first transistor correlates to a magnitude of the voltage; and
    a second transistor, comprising:
      a first node electrically coupled to the second node of the first transistor;
      a second node electrically coupled to the driver node that is electrically coupled to a driver circuit configured to apply a voltage to the second node of the second transistor; and
      a gate node electrically coupled to an output node of the first inverter,
  wherein the current output node is electrically coupled to a ground source, and the SRAM bit cell further comprises an analog-to-digital converter (ADC) circuit configured to convert a total current on the driver node into a digital output value and comprising:
    an input node electrically coupled to the driver circuit; and
    an output node configured to provide the digital output value.

27. The SRAM bit cell of claim 26, further comprising:
a first access transistor, comprising:
  a first node electrically coupled to a write bit line;
  a second node electrically coupled to an input node of the first inverter and an output node of the second inverter; and
  a gate node electrically coupled to a write word line; and
a second access transistor, comprising:
  a first node electrically coupled to the output node of the first inverter and an input node of the second inverter;
  a second node electrically coupled to a complement write bit line; and
  a gate node electrically coupled to the write word line.

28. The SRAM bit cell of claim 26, wherein:
the first transistor is an N-type metal-oxide semiconductor (MOS) (NMOS) transistor; and
the second transistor is an NMOS transistor.

29. The SRAM bit cell of claim 26, wherein:
the first transistor is an NMOS transistor; and
the second transistor is a P-type MOS (PMOS) transistor.

30. The SRAM bit cell of claim 26, wherein:
the first transistor is a PMOS transistor; and
the second transistor is an NMOS transistor.

31. The SRAM bit cell of claim 26, wherein:
the first transistor is a PMOS transistor; and
the second transistor is a PMOS transistor.

* * * * *